(12) United States Patent
Fujikawa et al.

(10) Patent No.: US 9,951,925 B2
(45) Date of Patent: Apr. 24, 2018

(54) LIGHT EMITTING DEVICE

(71) Applicant: NICHIA CORPORATION, Anan-shi, Tokushima (JP)

(72) Inventors: Yasuo Fujikawa, Yokohama (JP); Takuya Wasa, Kaifu-gun (JP)

(73) Assignee: NICHIA CORPORATION, Anan-Shi (JP)

(*) Notice: Subject to any disclaimer, the term of this patent is extended or adjusted under 35 U.S.C. 154(b) by 119 days.

(21) Appl. No.: 15/054,653

(22) Filed: Feb. 26, 2016

(65) Prior Publication Data
US 2016/0252231 A1    Sep. 1, 2016

(30) Foreign Application Priority Data

Feb. 27, 2015 (JP) ................. 2015-038646

(51) Int. Cl.
*F21V 1/00* (2006.01)
*F21V 11/00* (2015.01)
(Continued)

(52) U.S. Cl.
CPC ............... *F21V 7/04* (2013.01); *F21V 7/05* (2013.01); *F21V 19/005* (2013.01); *G02F 1/1336* (2013.01); *H01L 25/0753* (2013.01); *F21Y 2103/10* (2016.08); *F21Y 2105/16* (2016.08); *F21Y 2115/10* (2016.08); *H05K 1/189* (2013.01); *H05K 2201/10106* (2013.01)

(58) Field of Classification Search
CPC . F21V 7/04; F21V 19/005; F21V 7/05; H01L 25/0753; G02F 1/1336; H05K 2201/10106; H05K 1/189; F21Y 2103/10; F21Y 2105/16; F21Y 2115/10

USPC ..... 362/235, 241, 245, 249.04, 249.08, 341, 362/346, 97.1, 97.2, 97.3
See application file for complete search history.

(56) References Cited

U.S. PATENT DOCUMENTS 5,848,837 A * 12/1998 Gustafson ............... B64F 1/002
362/235
2014/0103822 A1   4/2014 Sakurai et al.
(Continued)

FOREIGN PATENT DOCUMENTS

CN      103578364 A  *  2/2014
JP      2014-082022 A    5/2014

OTHER PUBLICATIONS

Machine English Translation of CN103578364A Feb. 2014 Lin Liangda.*

*Primary Examiner* — Elmito Breval
*Assistant Examiner* — Glenn Zimmerman
(74) *Attorney, Agent, or Firm* — Foley & Lardner LLP

(57) ABSTRACT

A light emitting device includes a reflective sheet having a light reflecting face; a plurality of oblong flexible substrates; and a plurality of light emitting sections disposed at intervals on a face of each of the flexible substrates. The plurality of the flexible substrates comprises a first group of flexible substrates that are lined up at intervals in a first direction and a second group of flexible substrates that are lined up at intervals in a second direction such that the flexible substrates of the second group intersect the flexible substrates of the first group. The first group and the second group are layered in a thickness direction and adhered to at least one face of the reflective sheet so as to expose the plurality of light emitting sections.

24 Claims, 15 Drawing Sheets

(51) Int. Cl.

| | |
|---|---|
| *F21V 7/04* | (2006.01) |
| *F21V 7/05* | (2006.01) |
| *F21V 19/00* | (2006.01) |
| *G02F 1/1335* | (2006.01) |
| *H01L 25/075* | (2006.01) |
| *F21Y 105/16* | (2016.01) |
| *F21Y 103/10* | (2016.01) |
| *F21Y 115/10* | (2016.01) |
| *H05K 1/18* | (2006.01) |

(56) References Cited

U.S. PATENT DOCUMENTS

2014/0231835 A1\* 8/2014 Yamada ................. H05K 1/144
 257/88
2015/0055052 A1\* 2/2015 Tanabe .............. G02F 1/133504
 349/58
2017/0248278 A1\* 8/2017 Van Hout ............... F21V 25/02

\* cited by examiner

LIGHT EMITTING DEVICE

CROSS-REFERENCE TO RELATED APPLICATIONS

The present application claims priority under 35 U. S. C. § 119 to Japanese Patent Application No. 2015-038646, filed Feb. 27, 2015, the contents of which are incorporated herein by reference in their entirety.

BACKGROUND

The present disclosure relates to a light emitting device that includes a flexible substrate.

Japanese unexamined Patent Application Publication No. 2014-082022 (Patent Document 1) discloses an image display device in which the light sources (LEDs) used in the backlight are arranged in a lattice on the rear side (back face) of the liquid crystal panel. In the image display device disclosed in Patent Document 1, plural horizontally oblong sheet circuit boards (LED boards) each having plural LEDs mounted in a row at a prescribed pitch are arranged spaced apart in the widthwise direction in the space between the liquid crystal display panel and the reflective sheet/the housing back cover. In the central section of the liquid crystal panel, moreover, additional LEDs are mounted between two LEDs mounted at prescribed intervals on the LED substrates in order to increase the luminance at the central section of the screen.

SUMMARY

The light emitting devices according to one embodiment comprises a reflective sheet having a light reflecting face, and a plurality of oblong flexible substrates each including a plurality of light emitting sections provided at intervals on one face, in which the plurality of flexible substrates comprising a first flexible substrate group are lined up at intervals in a widthwise direction, the plurality of flexible substrates comprising a second flexible substrate group are lined up at intervals in a direction intersecting the first flexible substrate group, and the first and second flexible substrate groups are layered in a thickness direction and adhered to the reflective sheet so as to expose the plurality of light emitting sections.

DESCRIPTION

Figure 1:
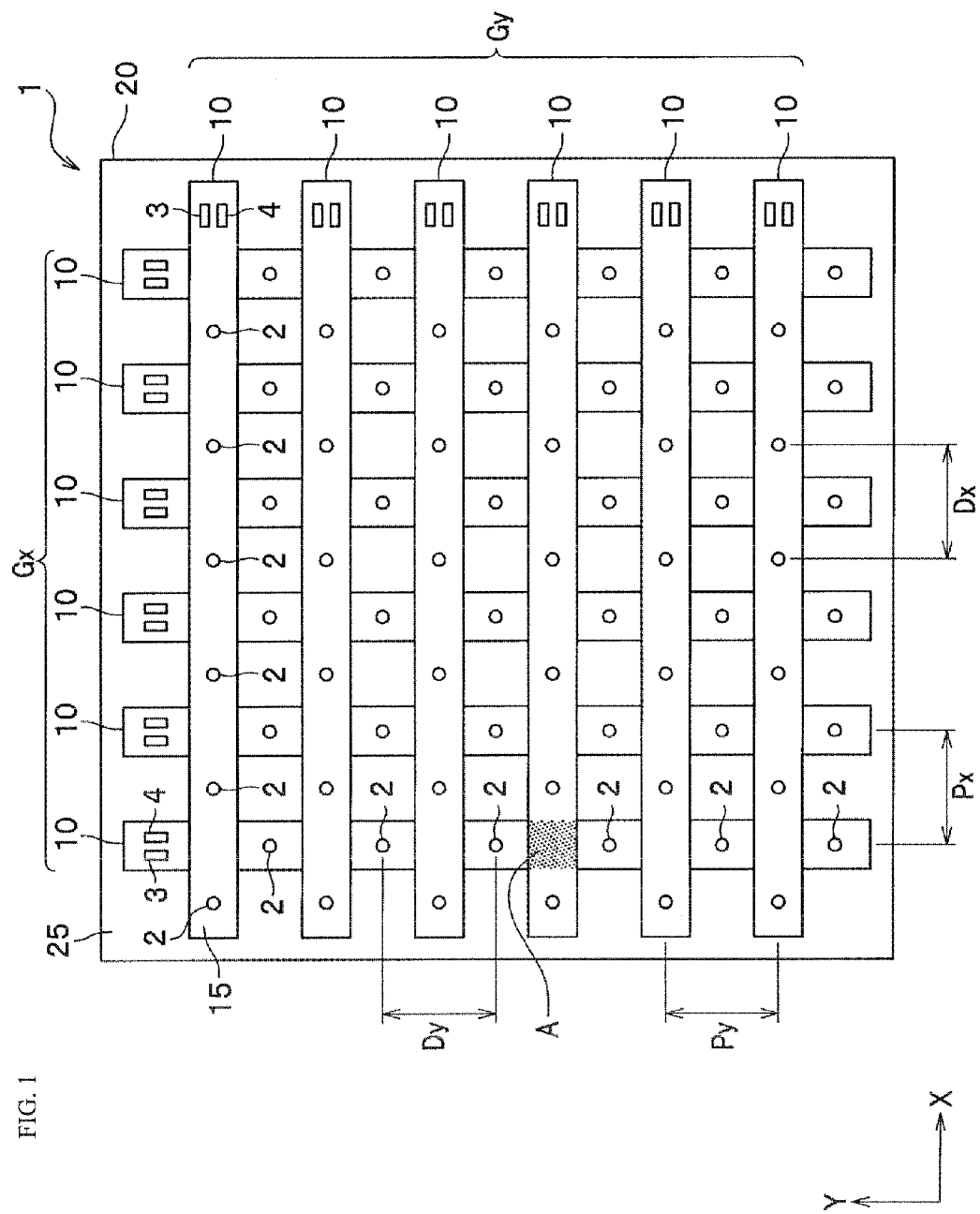
FIG. 1 is a schematic plan view of the light emitting device according to Embodiment 1.

Embodiments of the invention will be explained below with reference to the drawings. The following embodiments, however, exemplify the light emitting devices for the purpose of embodying the technical concepts of the invention, and do not limit the invention. The dimensions, materials, and shapes of the constituent elements, as well as the relative positioning thereof, described in the embodiments are offered to merely as examples and are not intended to limit the scope of the invention to those described unless otherwise specifically noted. The sizes of the components, their positional relationship, or the like, shown in the drawings might be exaggerated for clarity of explanations.

Embodiment 1

Structure of Light Emitting Device Construction

In the following explanation, the horizontal and vertical directions in FIG. 1 are denoted as x-axis and y-axis directions, respectively, and the direction orthogonal to both x- and y-axis directions (orthogonal to the sheet of paper) is denoted as z-axis direction. The light emitting device 1 according to Embodiment 1 shown in the figure emits light forward of the page. The light emitting device 1 includes a reflective sheet 20 and a plurality of flexible substrates (12 shown here; hereinafter referred to as the flexible substrates 10).

As shown in FIG. 1, the group of flexible substrates 10 (six shown here) lined up at intervals in the widthwise direction (x-axis direction) is referred to as the first flexible substrate group Gx. The flexible substrates 10 of the first flexible substrate group Gx are arranged at a certain pitch Px. On each flexible substrate 10 of the first flexible substrate group Gx, a plurality of light emitting sections 2 (six shown here) are mounted at a certain pitch Dy. At one end of the upper face 15 of each flexible substrate 10 of the first flexible substrate group Gx (upper end in FIG. 1), connectors 3 and 4 are mounted for electrically connecting the wiring pattern 13 (see FIG. 3) to an external power supply using a wire harness.

The group of flexible substrates 10 lined up at intervals in the direction intersecting the flexible substrates 10 of the first flexible substrate group Gx is referred to as the second flexible substrate group Gy. In this embodiment, each flexible substrate 10 of the second flexible substrate group Gy is arranged substantially perpendicular to each flexible substrate 10 of the first flexible substrate group Gx. The flexible substrates 10 of the second flexible substrate group Gy are arranged at a certain pitch Py. On each flexible substrate 10 of the second flexible substrate group Gy, a plurality of light emitting sections 2 (six shown here) are mounted at a certain pitch Dx. At one end of the upper face 15 of each flexible substrate 10 of the second flexible substrate group Gy (right end in FIG. 1), connectors 3 and 4 are mounted.

As shown in FIG. 1, in the light emitting device 1, the first flexible substrate group Gx and the second flexible substrate group Gy are layered in the thickness-wise direction (z-axis direction) and adhered to the reflective sheet 20 so as to expose a plurality of light emitting sections 2. In the light emitting device 1, the layered flexible substrates 10 of the first flexible substrate group Gx and the second flexible substrate group Gy adhere their faces opposite the upper faces 15 (i.e., back faces) to the front face 25, the light reflecting face of the reflective sheet 20.

As shown in FIG. 1, the flexible substrates 10 are layered to form a lattice on the front face 25 of the reflective sheet 20. Here, the light emitting sections 2 provided on the flexible substrates 10 are positioned between two lattice points (overlapped regions A of the flexible substrates 10). In other words, the flexible substrates 10 of the second flexible substrate group Gy are layered so as to fill the regions between two adjacent light emitting sections 2 respectively provided on the adjacent flexible substrates 10 of the first flexible substrate group Gx.

In installing plural circuit boards on the support or the housing using conventional techniques, however, it may be unavoidable to join the circuit boards in a configuration where they are arranged spaced apart, or adjacent to one another, and thus may be difficult to flexibly configure the circuit boards.

An object of certain embodiments according to present invention is to provide a light emitting device capable of increasing the circuit board configuration flexibility with a simplified construction.

The light emitting devices according to the embodiments of the present disclosure can increase the circuit board configuration flexibility by means of a simplified construction.

Reflective Sheet 20

As shown in FIG. 1, reflective sheet 20 is provided to reflect the light from the light emitting sections 2 to improve the effectiveness in extracting the light from the light emitting device 1. The reflective sheet 20 is an insulating sheet having light reflectance, and is preferably a flame retardant sheet. The reflective sheet 20 is preferably a film including a synthetic resin, for example, a white polyethylene terephthalate (white PET) or a white glass fiber reinforced epoxy composite.

The size (that is, vertical and horizontal lengths in a plan view), and the thickness of the reflective sheet 20 are not particularly limited, as long as it has a large enough area for disposing the flexible substrates 10 at a proper pitch required for the finished product of the light emitting device 1 thereon. Its size can be suitably selected in accordance with the purpose. For example, in the case where the light emitting device is used for a television backlight application, the vertical and horizontal lengths may be several tens of centimeters or larger. In this case, the thickness of the reflective sheet 20 may be in a range between about several tens and several hundreds of micrometers. Any commercially available PET film used as an LCD backlight reflective sheet (for example, the white low specific gravity grade (E6SR) of Lumirror™, 188 μm in thickness, high reflectance type (product number 188) manufactured by Toray Industries, Inc., or the like) can be employed as the reflective sheet 20.

Flexible Substrate

Figure 5A:
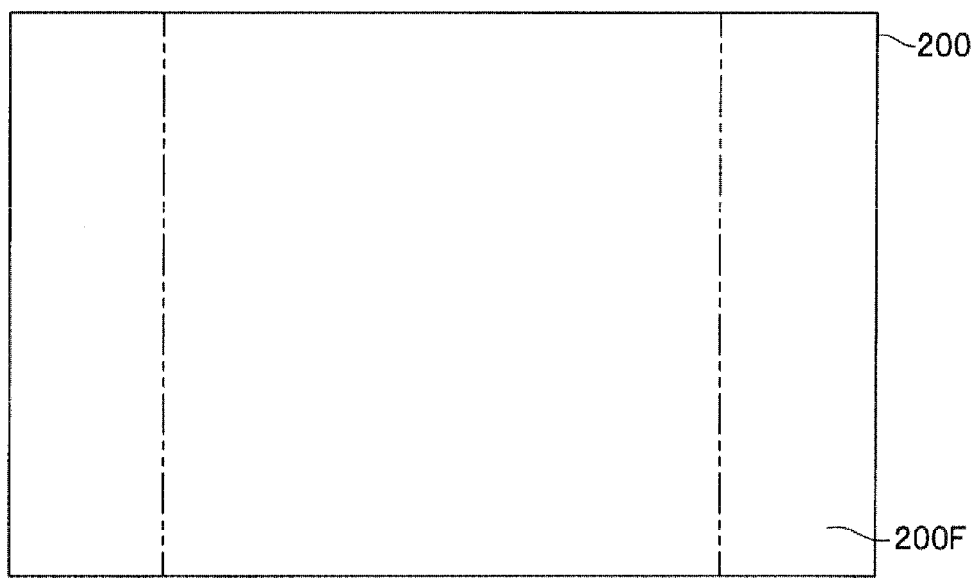
FIG. 5A is a schematic view showing a production step for the light emitting device according to Embodiment 1, which is a plan view of the reflective sheet.
Figure 5B:
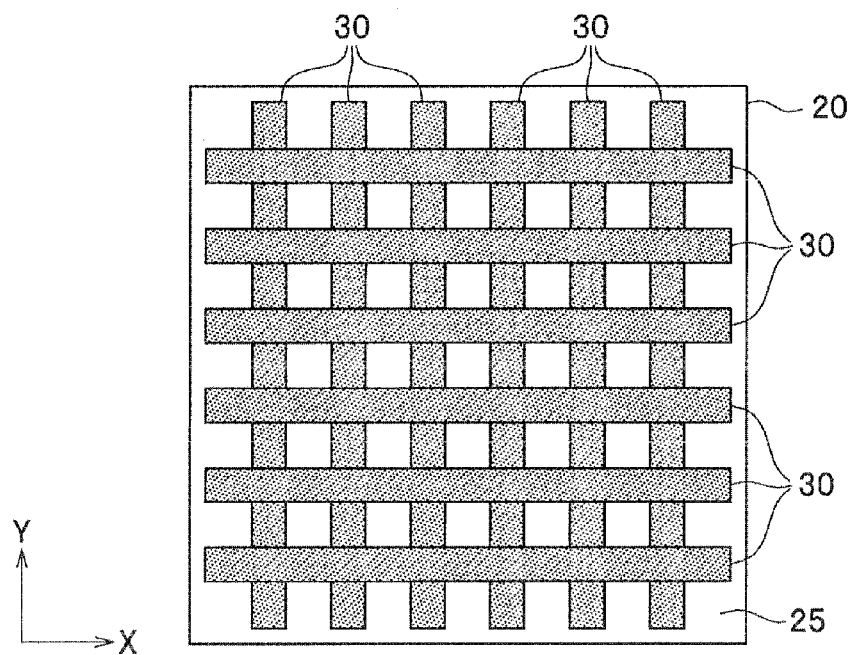
FIG. 5B is a schematic view showing a production step for the light emitting device according to Embodiment 1, which is a plan view of the reflective sheet to which an adhesive members are provided.

Each flexible substrate 10 is adhered to the reflective sheet 20 using an adhesive member 30 (see FIG. 5B). The adhesive member 30 has insulating properties, and furthermore, preferably has high flame retardancy. It is preferable to use, for example, a double-sided tape (pressure sensitive adhesive member) for the adhesive member 30, and, for example, an acrylic-based double-sided tape manufactured by DIC Corporation (product number 8606TN, or the like) can be used. Also, a thermosetting or thermoplastic resin liquid adhesive, or a hot melt adhesive sheet can be also used for the adhesive member 30.

Figure 2:
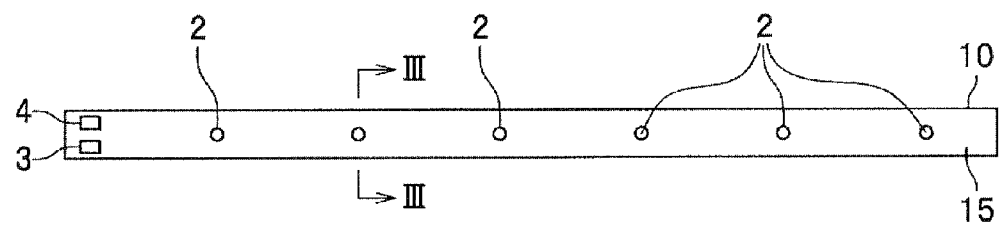
FIG. 2 is a schematic plan view of a flexible substrate of the light emitting device according to Embodiment 1.
Figure 3:
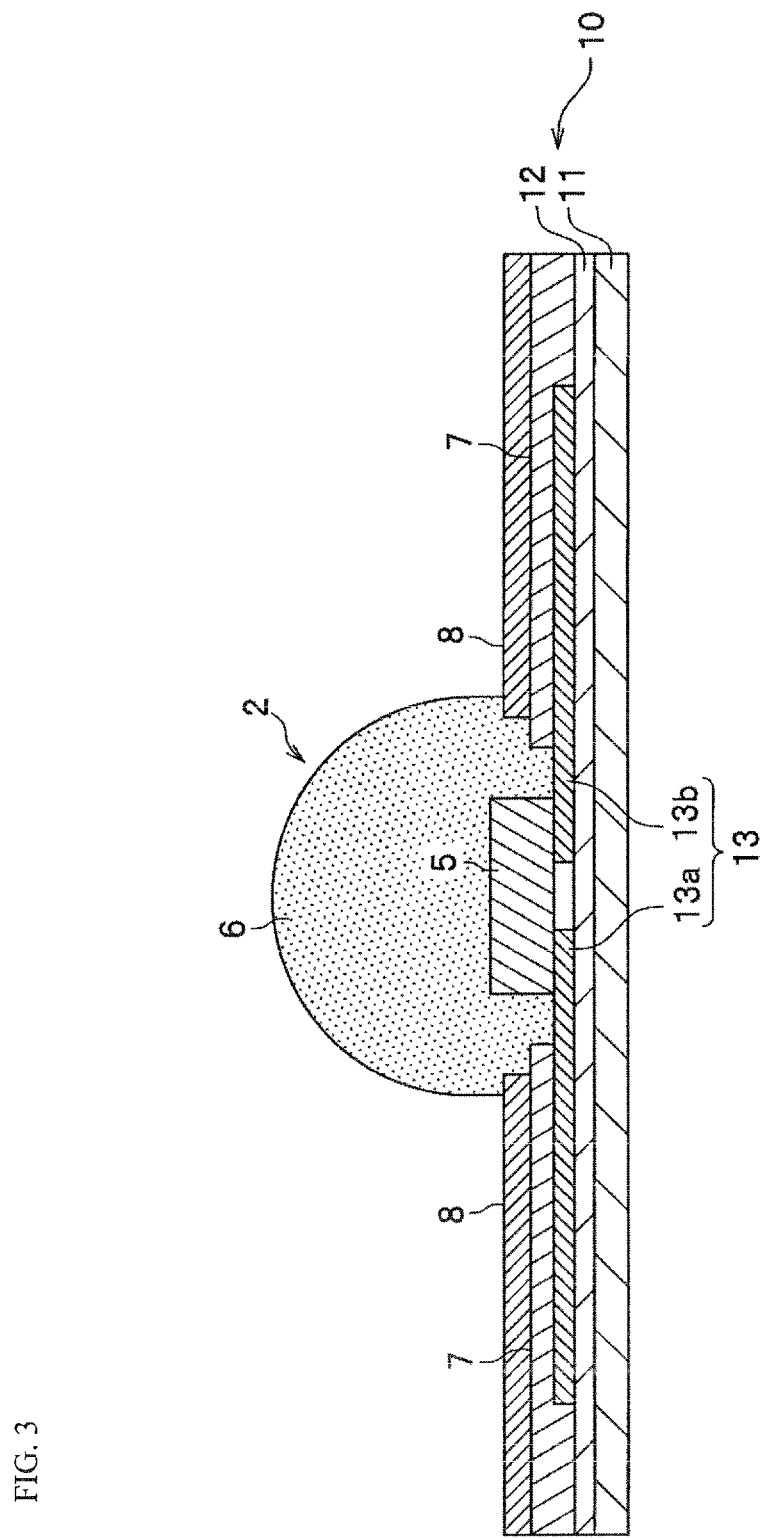
FIG. 3 is an enlarged cross-sectional view of the flexible substrate of the light emitting device according to Embodiment 1 viewed in the direction indicated by arrows in FIG. 2.

The flexible substrate 10 shown in FIGS. 2 and 3 is disposed on the reflective sheet 20 after having the light emitting elements 5 and other components mounted thereon. As shown in FIG. 1, the pitches Px and Py for arranging the flexible substrates 10 on the reflective sheet 20 are set larger than the width of a flexible substrate 10, roughly two to three times the width of a flexible substrate 10. The pitches Px and Py shown as an example here are equal. A flexible substrate 10 is a flexible printed board having a wiring pattern formed on at least one face of its sheet base body 11.

Each flexible substrate 10, as shown in FIG. 3, has a region where the base body 11 and the wiring member 13 (wiring pattern) are stacked in that order. On the wiring pattern 13, a region where an underlayer 7, which be used as a base for the reflective layer 8, alone is stacked, and a region where both the underlayer 7 and the reflective layer 8 are stacked. An adhesive layer 12 may be disposed between the base body 11 and the wiring pattern 13. In the explanation below, the face of a flexible substrate 10 on which the wiring pattern 13 is formed may be referred to as the upper face 15 (see FIG. 2).

The base body 11 is the base of the flexible substrate 10, and is made of a flexible insulating material. Polyimide, for example, is a suitable material for the base body 11. A molded reinforced plastic material made by pre-impregnating a fibrous material, such as glass cloth or carbon fiber fabric, with a resin (e.g., glass fiber reinforced epoxy composite, prepreg, or the like) is also suitable. A resin film, such as polyethylene terephthalate (PET), polyethylene naphthalate, polyetherimide, polyphenylene sulfide, liquid crystal polymer, or the like, may also be used. The thickness of the base body 11 is, for example, in a range between about 10 and 300 μm. The base body 11 may be of either a single layer or multilayer structure.

The adhesive layer 12 adheres the base body 11 and the wiring pattern 13. As material for the adhesive layer 12, examples include a urethane-based adhesive, or the like. The adhesive layer 12 may not be required in the case where the base body 11 is made of a material capable of directly adhering to the wiring pattern 13 such as a molded reinforced plastic material mentioned above, for example. In these cases, the wiring member 13 is formed directly on the base body 11.

The wiring pattern 13 includes a conductive material. The wiring pattern 13 is formed on the base body 11, for example, via an adhesive layer 12, which creates an electrical circuit when electrically connected to each light emitting element 5. The wiring member 13, for example, is made of a copper foil. Besides that, an aluminum foil, aluminum alloy foil, stainless steel foil, or the like, can also be employed. The thickness of the wiring pattern may be in a range between 10 μm and 50 μm.

Figure 4A:
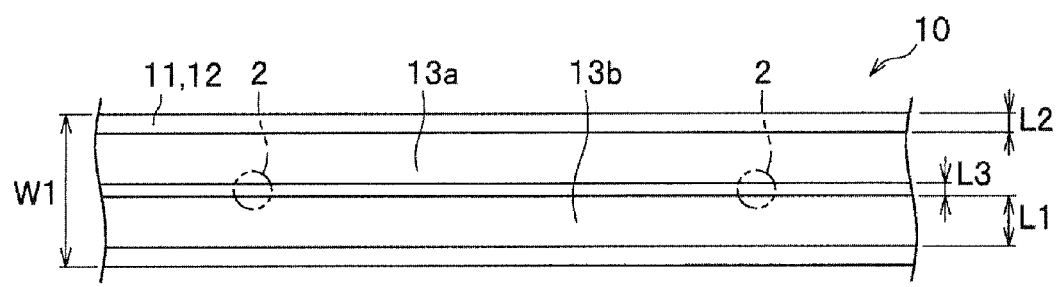
FIG. 4A is a schematic view of a flexible substrate of the light emitting device according to Embodiment 1 showing one example of the wiring pattern formed below the reflective layer and the underlayer.

As shown in FIGS. 3 and 4A, a groove extending in the longitudinal direction of the flexible substrate 10 is formed between two lines of wiring member 13a and 13b which make up the wiring pattern 13 formed on the flexible substrate 10. The groove can be formed by removing the material forming the wiring pattern 13 formed on the flexible substrate 10 by etching or the like.

As shown in FIG. 4A, each of the two wiring members 13a and 13b is formed in a linear shape along a direction that is substantially parallel to the longitudinal direction of the flexible substrate 10. The width of the flexible substrate 10 is denoted as W1, and the width of each of the two wiring members 13a and 13b is denoted as L1. The width from an edge of each of the wiring members 13a and 13b to the outer edge of the base body 11 (hereinafter referred to as the creepage distance) is denoted as L2, and the gap between the two wiring members 13a and 13b is denoted as L3. In this case, preferably, the relationship expressed by the following formula (1) is established.

$$W1 = 2 \times L1 + 2 \times L2 + L3 \qquad \text{formula (1)}$$

The widths L1 to L3 can suitably be selected in accordance with the purpose and application. For example, in the case where the light emitting device will be installed in a backlight for a television, the widths L1, L2, and L3 can be set, for example, to 6 mm, 2 mm, and 200 μm, respectively.

As shown in FIGS. 3 and 4A, each light emitting element 5 is disposed on the gap (groove) between the two wiring members 13a and 13b. Two adjacent light emitting elements 5 are disposed so that electrodes of the light emitting elements having the same polarity adjacent each other in the longitudinal direction of the flexible substrate 10 and are connected in parallel.

Light Emitting Section 2

As shown in FIGS. 3 and 4A, the light emitting element 5 is electrically connected to the wiring members 13. As shown in FIG. 1, the pitches Dx and Dy for arranging the light emitting sections 2 on the flexible substrates 10 (see FIG. 1) are set larger than the width of a flexible substrate 10, roughly two to three times the width of a flexible substrate 10. Here, as one example, the pitches Dx and Dy are equal. Moreover, shown as an example, they are equal to the pitches Px and Py for lining up the flexible substrates 10. The light emitting section 2, as shown in FIG. 3, includes a light emitting element 5 and a sealing material 6.

Light Emitting Element

The light emitting elements 5 emit light when a prescribed voltage is applied. An emission wavelength of the light emitting elements can be visible, ultraviolet, or infrared light, or the like.

In the case where using the light emitting elements emit visible light, the emission color can be any of blue, green, and red light, for example.

A white light emitting element such as a blue light emitting element coated with a fluorescent material can also be used.

The semiconductor materials used in the light emitting element 5 can be any compound semiconductor, such as group III-V, group or the like, ted in advance.

In the case of visible light, the emission color is not limited, and any of blue, green, and red light emitting elements can be used.

Moreover, a white light emitting element, which is a blue light emitting element coated with a fluorescent material, can also be used.

The semiconductor materials used in the light emitting element 5 are not particularly limited, and any compound semiconductor, such as group III-V, group II-VI, or the like, can be used.

The light emitting elements 5 may be flip chip mounted or face-up mounted on the wiring member 13. As shown in FIGS. 3 and 4, in the case of using flip chip mounting, the p-side electrode (i.e. anode) and the n-side electrode (i.e. cathode) of each light emitting element 5 are bonded to a pair of wiring members 13a and 13b, respectively, via a pair of conductive joining material. For the conductive joining material, an Sn—Ag—Cu-based, Sn—Cu-based, or Au—Sn-based solder, Au metal bump, Ag paste, or the like, can be used.

In the case of using face-up mounting manner, each light emitting element 5 may be bonded on the base body 11 and/or the wiring member 13 by an insulating joining material, such as a resin, or any of the conductive joining materials mentioned above, and electrically connected to the wiring pattern 13 by wires. In the case where the element substrate of the light emitting element 5 is conductive, one of the electrodes is electrically connected to the wiring member 13a or 13b using any of the aforementioned conductive joining materials, while the other electrode is electrically connected to another wiring member 13a or 13b using a wire.

Sealing Material

The sealing member 6, as shown in FIG. 3, encloses and protects the light emitting element 5. The sealing member 6 is light transmissive. The sealing member 6 may be provided on the upper face of the flexible substrate 10 so as to cover the light emitting element 5. The viscosity of the material forms the sealing member 6 can be adjusted so as to be applicable by printing or by using a dispenser, for example. The sealing member 6 can be cured by way of heat treatment or UV light irradiation. The sealing member 6 preferably has good adhesion with the flexible substrate 10 and the light emitting element 5. Also, the sealing member 6 preferably has flexibility. The emission wavelength and light distribution characteristics of the light emitting device can be adjusted by containing wavelength conversion material such as a YAG-based, TAG-based, or silicate-based phosphor, or the like in the sealing, member 6. Also, an inorganic light diffusing material, such as titanium oxide, silicon oxide, alumina, zinc oxide, fine glass powder, or the like; or an organic light diffusing material, such as acrylic, polystyrene, or the like can be contained in the sealing member 6. The sealing member 6 preferably has a convex shape from the perspective of improving light extraction efficiency. The shape of the sealing member 6 can be an approximate hemispherical shape, an oblong convex shape in a cross-sectional view, a circular or elliptical shape in a plan view, for example.

Connector

The connectors 3 and 4 are disposed in correspondence to the positive and negative polarities and disposed on the wiring pattern 13. Metal terminals such as DF59M manufactured by Hirose Electric Co., Ltd., or molded metal terminals, such as DF61 manufactured by Hirose Electric Co., Ltd., can be used as the connectors 3 and 4.

The p-side electrode of the light emitting element 5 is electrically connected to the connector 3 via the wiring member 13a, and is electrically connected to the positive terminal of an external power supply via a wire harness, for example.

The n-side electrode of the light emitting element 5 is electrically connected to the connector 4 via the wiring member 13b, and is electrically connected to the negative terminal of an external power supply via a wire harness, for example.

Examples of materials of the connectors 3 and 3 include rustproofed copper with tinning plating. Examples of methods of joining the connectors 3 and 4 with the wiring pattern 13 include reflow soldering, ultrasonic bonding, resistance welding, crimping, or the like.

Underlayer 7

The underlayer 7 is used as the base for the reflective layer 8. As shown in FIG. 3, an underlayer 7 is disposed on the flexible substrate 10. The underlayer 7 preferably covers the wiring member 13 and/or the base body 11 or the adhesive layer 12 partially or entirely, while exposing a portion of the wiring member 13. The underlayer 7 has openings (for example, a circular shape) for exposing a pair of wiring members 13a and 13b which correspond to a pair of positive and negative polarities, and the groove between the pair of positive and negative wiring members 13a and 13b. The size of the opening is preferably formed in the minimum size required to enable the electrical connection between the light emitting element 5 and the wiring pattern 13 within the opening. The openings may have different in shape and size each other, but are preferably the same in shape and size.

The underlayer 7 can include a thermosetting resin, thermoplastic resin, or the like, for example. Specific examples include modified epoxy resin compositions, such as epoxy resin compositions, silicone resin compositions, silicone modified epoxy resins, and the like; modified silicone resin compositions, such as epoxy modified silicone resins, or the like; polyimide resin compositions, modified polyimide resin compositions; polyphtalamide (PPA); polycarbonate resins; polyphenylene sulfide (PPS); liquid crystal polymers (LCP); ABS resins; phenol resins; acrylic resins; PBT resins, or the like.

The underlayer 7 preferably contains a material that reflects the light emitted from the light emitting element 5, as well as the light whose wavelength has been converted by the wavelength conversion material. The reflectance here with respect to the light described is preferably 60% or higher, more preferably 65% or higher, or 70% or higher. Examples of such materials include light-reflecting materials. Examples of light-reflecting materials include titanium dioxide, silicon dioxide, zirconium dioxide, potassium titanate, alumina, aluminum nitride, magnesium oxide, boron nitride, mullite, niobium oxide, and various rare earth oxides (for example, yttrium oxide and gadolinium oxide). The underlayer 7 may contain additives, including fibrous fillers, such as glass fibers and wollastonite, carbon, talc, and inorganic fillers such as silicon oxide, or the like. The content of these materials can be in a range between 5 and 50 weight percent relative to the total weight of the underlayer 7.

The underlayer 7 is preferably formed in the thickness so that its upper face is lower than the upper face of the light emitting element 5. The underlayer 7 preferably has a thickness which does not undermine the flexibility of the flexible substrate 10, and can be formed, for example, in thickness of about 1 to 50 μm. The underlayer 7 can be formed on one face of the base body by printing, potting, spin coating, dipping, or the like.

Reflective Layer 8

The reflective layer 8, as shown in FIG. 3, is disposed over the wiring pattern 13 in order to increase the light extraction efficiency of the light emitting device 1. In this embodiment, the reflective layer 8 is disposed over the flexible substrate 10 spaced apart from the wiring member 13 in the stacking direction by interposing the underlayer 7.

In the light emitting device 1, since the second flexible substrate group Gy is layered on the first flexible substrate group Gx as shown in FIG. 1, it is preferable to dispose the reflective layer 8 across the entire surfaces of the flexible substrates 10 of the second flexible substrate group Gy. On the flexible substrates 10 of the first flexible substrate group Gx, it is preferable to dispose the reflective layer 8 in the regions that have no flexible substrates 10 of the second flexible substrate group Gy layered thereon.

The reflective layer 8 is preferably disposed, for example, in the form of islands (that is, a plurality of separated reflective layers are disposed) in correspondence with the quantity of the light emitting elements 5 disposed on the flexible substrates 10. The reflective layer 8 is preferably formed as islands that are separated from one another. For example, The reflective layer 8 formed as islands may be separated based on the configuration of the light emitting section 2, or based on the number of light emitting sections 2.

As shown in FIG. 3, an edge of the reflective layer 8 on the light emitting section 2 side (that is, an edge facing the opening) is preferably more distant from the light emitting section 2 than the edge of the underlayer 7 on the light emitting section 2 side. In this case, the distance between the edge of the reflective layer 8 closer to the light emitting section 2 and the edge of the underlayer 7 closer to the light emitting section 2 is from about 0.1 to 0.5 mm, for example. An area of the opening in the reflective layer 8 can be between about 0.8 and 2.5 times, preferably between about 1 and 2 times, more preferably between about 1.3 and 1.6 times, of an area of the opening in the underlayer 7.

The reflective layer 8 can be formed from any of the materials for the underlayer 7 mentioned above. In other words, the reflective layer 8 can be formed using, for example, a thermosetting resin, thermoplastic resin, or the like. Furthermore, it is preferable for these resins to contain a light-reflecting material and/or other additives. The reflective layer 8 preferably has the light reflectance of 80% or higher with respect to the light from the light emitting element as well as the light whose wavelength has been converted by wavelength conversion material. It is preferable for the reflective layer 8 to have a higher light reflectance than the underlayer 7. The reflective layer 8 can contain the light-reflecting material and/or other additives in the ratio of from 5 to 70 weight percent to the total weight of the reflective layer 8. The reflective layer 8, however, preferably contains the same materials or have the same composition as the underlayer 7. The light reflectance of the reflective layer 8 mentioned above is preferably higher than that of the underlayer 7. For this purpose, the reflective layer 8 preferably contains a light-reflecting material having a higher light reflectance than that contained in the underlayer 7 and/or contains a larger amount of the light-reflecting material.

By forming the reflective layer 8 on the underlayer 7, the role of protecting the wiring member 13 by ensuring the insulating properties of the flexible substrate 10 and the role of increasing the light extraction efficiency by preventing the light emitted from the light emitting elements 5 from being absorbed by the substrates can be separated. More particularly, with this arrangement, even though the adhesion to the sealing member 6 and the light reflectance of the under layer 7 and the reflective layer may be contrary properties, having the underlayer 7 and the reflective layer 8 play different roles as described above can attain a balance between the adhesion and light reflectance properties.

The thickness of the reflective layer 8 can be suitably set within the ranges discussed in connection to the thickness of the underlayer 7. The thickness of the reflective layer 8 is preferably substantially the same as that of the underlayer 7. The thickness of the reflective layer 8 is more preferably set to achieve enough light reflectance in accordance with the materials, particularly the type and the content of the light-reflecting material, used to compose the reflective layer 8. The reflective layer 8 can be formed separately from the underlayer 7 on one face of the base body 11 by using any of the methods mentioned in connection with the forming method for the underlayer 7.

Method for Producing a Light Emitting Device

Next, a method for producing the light emitting device 1 will be explained.

First, as shown in FIG. 5A, a reflective sheet 200 larger than the outer shape of the light emitting device 1 is prepared. The reflective sheet 20 in this embodiment is horizontally oblong, having a vertical length that is substantially equivalent to the finished product height of the light emitting device 1.

Then, as shown in FIG. 5B, adhesive members 30 are disposed on the front face 200F, the light reflecting face of the reflective sheet 200. The adhesive members 30 are about the same in length and width as the flexible substrates 10. The adhesive members 30 used here as an example is acrylic-based double-sided tapes. A plurality of adhesive members 30 (six shown here) are lined up at a certain pitch in the x-axis direction in alignment with the positions of the flexible substrates 10 of the first flexible substrate group Gx and adhered to the reflective sheet 200. A plurality of adhesive members 30 (six shown here) are lined up at a certain pitch in the y-axis direction in alignment with the positions of the flexible substrates 10 of the second flexible substrate group Gy and adhered to the reflective sheet 200. Then, the reflective sheet 200 is cut to the finished product width of the light emitting device 1. The cut reflective sheet is denoted as reflective sheet 20. The reflective sheet 200 may be cut prior to disposing the adhesive members 30.

Figure 6A:
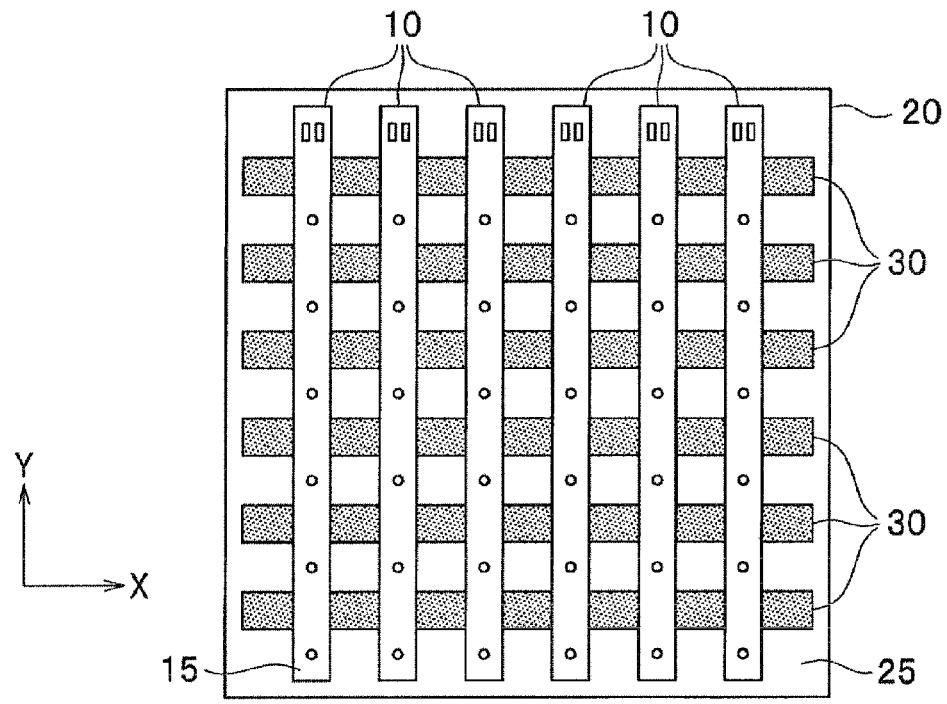
FIG. 6A is a schematic view showing a production step for the light emitting device according to Embodiment 1, which is a plan view of the reflective sheet to which a first flexible substrate group is bonded.

Next, as shown in FIG. 6A, the back faces of the flexible substrates 10 of the first flexible substrate group Gx are bonded to the front face 25 of the reflective sheet 20 via the adhesive members 30. The flexible substrates 10 are arranged so that the connectors 3 and 4 disposed on each of flexible substrates 10 are all aligned at one side. This can simplify the connection between an external power supply and the connectors 3 and 4.

Figure 6B:
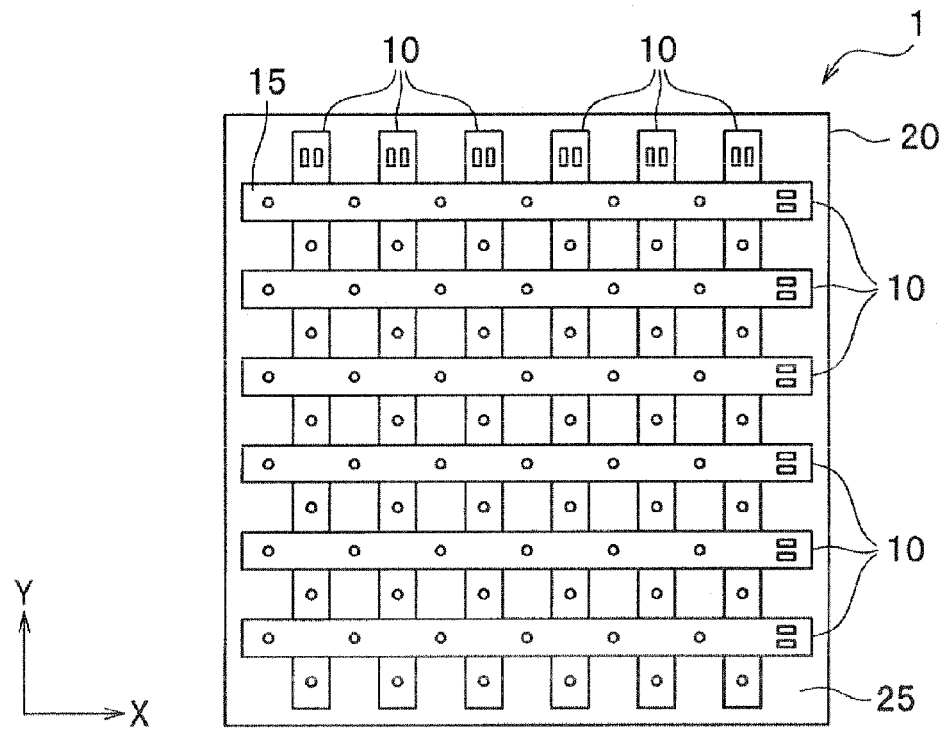
FIG. 6B is a schematic view showing a production step for the light emitting device according to Embodiment 1, which is a plan view of the reflective sheet to which a second flexible substrate group is further bonded.

Then, as shown in FIG. 6B, the back faces of the flexible substrates 10 of the second flexible substrate group Gy are bonded to the front face 25 of the reflective sheet 20 via the adhesive members 30. The flexible substrates 10 are similarly arranged so that the connectors 3 and 4 disposed on each of flexible substrates 10 are all aligned at one side.

The light emitting device 1 according to this embodiment includes the first flexible substrate group Gx lined up in the x-axis direction at a certain pitch and the second flexible substrate group Gy arranged in the y-axis direction at a certain pitch which are layered in the thickness-wise direction adhered to the front face 25 of the reflective sheet 20. In a conventional light emitting device, rigid substrates of about 1-1.6 mm in thickness are normally used as circuit boards, which are arranged spaced apart so as not to be layered. In other words, in a conventional light emitting device, it may be needed to arrange the circuit boards spaced apart each other because layering them increased the thickness, i.e. they may not be arranged with much freedom.

In the case of the flexible substrates 10, which have flexibility, the substrates may be, for example, in a range between 200 and 300 μm in thickness. For the reflective sheet 20, moreover, a thin type of about 30-50 μm in thickness can be used. Accordingly, the overall thickness of the flexible substrates 10 layered in the thickness-wise direction on the reflective sheet 20 can be thin, for example less than one half of the thickness of the substrate of a conventional light emitting device. In other words, the light emitting device 1 according to this embodiment can increase the flexibility for arranging the circuit boards by using a simplified structure as layering the flexible substrates 10 on the reflective sheet 20 in the thickness-wise direction, as compared to merely arranging circuit boards spaced apart.

The light emitting device 1 includes plural flexible substrates 10 lined up at a prescribed pitch, intersected, and bonded to the reflective sheet 20 having a larger area than the flexible substrates. This can increase the light extraction efficiency of the light emitting device 1 by reducing the light emitted from the light emitting sections 2 from being absorbed by the flexible substrates 10.

Furthermore, as shown in FIG. 3, the light emitting sections 2 including the light emitting elements 5 mounted on the flexible substrates 10 and covered by the convex sealing member 6 may have light distribution characteristics of high light intensity over a wide angle region as compared to, for example, a light emitting device having a package with a recess for light emitting elements disposed Accordingly, the light emitting device 1 having a two-dimensional array of light emitting sections 2 lined up at certain intervals can be a surface emission light source having a wide light distribution angle, which can be a suitable device for a lighting device, such as a backlight.

In the light emitting device 1, moreover, the reflective sheet 20 integrated with the flexible substrates 10 can be deemed as a large device substrate. The light emitting device 1 having such a large area device substrate may not require the use of an insulating white ink, referred to as white resist above, in many regions of reflective sheet 20 where no flexible substrates 10 are adhered, preferably the regions accounting for more than one half of the reflective sheet. Therefore, the amount of insulating white ink used in the light emitting device 1 can be reduced. Accordingly, a bendable large area light emitting device 1 can be produced inexpensively.

In the light emitting device 1, furthermore, the plural flexible substrates 10 and the reflective sheet 20 as a whole can be deemed as a common device substrate for the plural light emitting sections 2. In the overlapped regions A (only one location is indicated as an example in FIG. 1) of the flexible substrates 10 intersected by another group of flexible substrates 10, the thickness of the device substrate is greater than the other regions, and no light emitting sections 2 are provided. Accordingly, the regions A may have a higher heat dissipation rate than the other regions. If plural flexible substrates 10 were all arranged in parallel in a stripe pattern, instead of intersecting them as shown in FIG. 1, a separate heat dissipating means might be required. The light emitting device 1, in contrast, can improve heat dissipation by using a simplified structure as layering the flexible substrates 10 on the reflective sheet 20 in the thickness-wise direction.

Furthermore, if the plural flexible substrates 10 were all arranged in parallel in one direction (for example, x-axis direction) in a stripe pattern, instead of intersecting as shown in FIG. 1, the light emitting device 1 might be prone to curling and breaking along a direction that is used as the central axis. The light emitting device 1, in contrast, can have increased rigidity, and thus reduced possibility of breaking because the flexible substrates 10 are arranged to intersect with one another as shown in FIG. 1. This can increase handleability of the light emitting device 1 having a large area device substrate when handled by a worker or a robot.

Variation of Embodiment 1

Figure 4B:
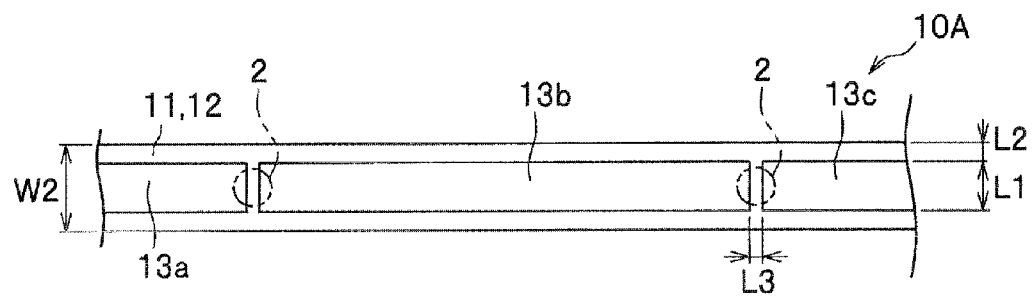
FIG. 4B is a schematic view of the flexible substrate of the light emitting device according to a variation of Embodiment 1 showing one example of the wiring pattern formed below the reflective layer and the underlayer.

As shown in FIG. 4B, the light emitting device according to a variation of Embodiment 1 has a differently shaped wiring pattern 13 on the flexible substrate 10A from that of the light emitting device 1 according to Embodiment 1. The flexible substrate 10A has wiring members 13$a$, 13$b$, 13$c$ (collectively wiring member 13), which arranged along the longitudinal direction of the flexible substrate 10. Two light emitting sections 2 are disposed between two of these three wiring members 13$a$, 13$b$, 13$c$, respectively. The grooves between the wiring members 13 extend in the direction perpendicular to the longitudinal direction of the flexible substrate 10A. The two adjacent light emitting sections 2 (light emitting elements 5) are disposed so that these electrodes having opposing polarities face to each other in the longitudinal direction of the flexible substrates 10A and connected in series.

As shown in FIG. 4B, the width of the flexible substrate 10A is denoted as W2. The width of the wiring members 13 formed in one line in the longitudinal direction of the flexible substrate 10A is denoted as L1, and the creepage distance is denoted as L2. In this case, preferably, the relationship expressed by the following formula (2) is established. The groove width between the wiring members 13$a$ and 13$b$, and between the wiring members 13$b$ and 13$c$, is denoted as L3.

$$W2 = L1 + 2 \times L2 \quad \text{formula (2)}$$

Figure 14:
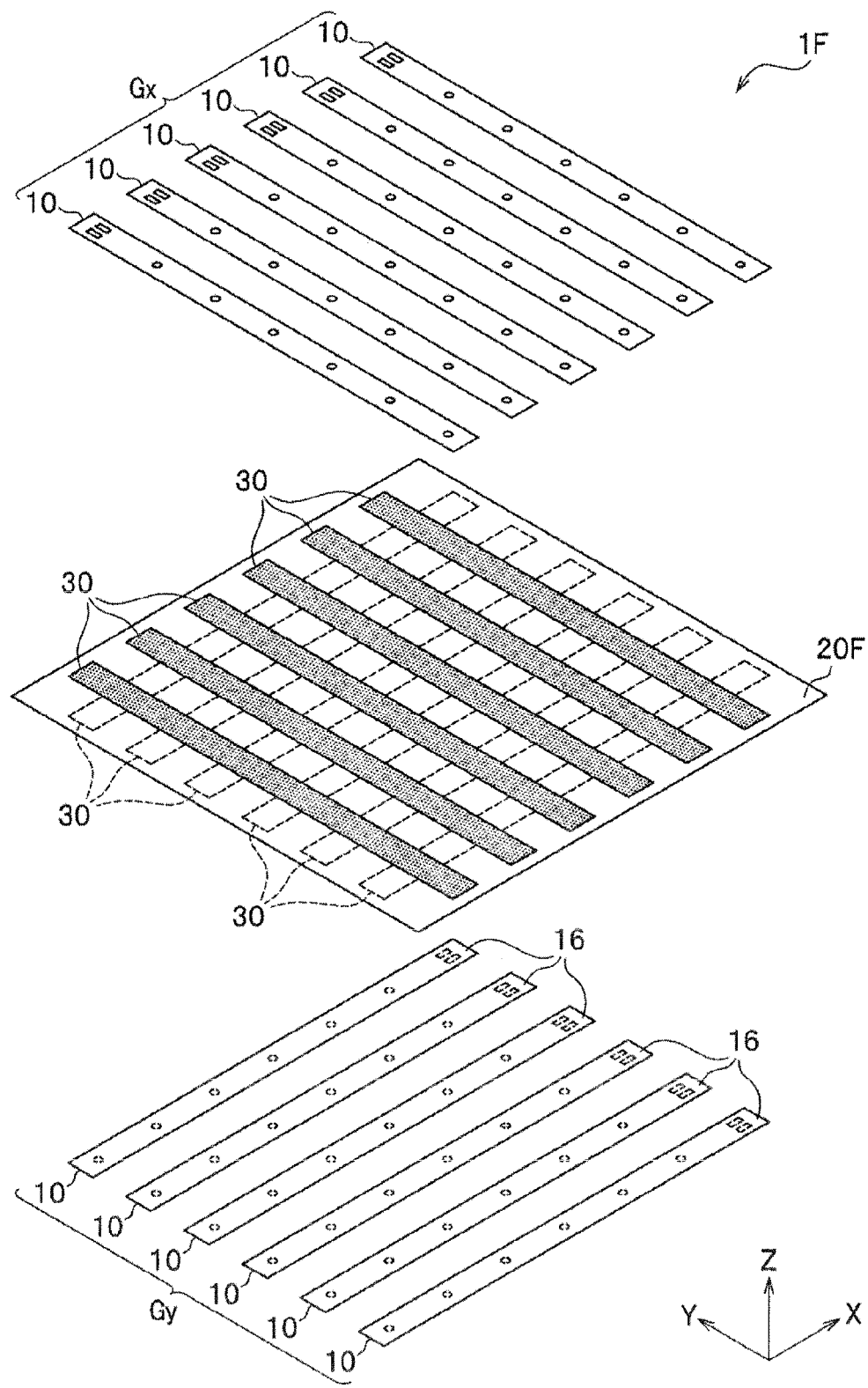
FIG. 14 is an exploded perspective view of the light emitting device according to Embodiment 6.

Either the connector 3 or 4 in this variation may be placed at the left end, and the other at the right end, of the flexible substrates 10A, as shown FIG. 14. At every groove between the wiring members 13, one piece of light emitting element 5 may be electrically connected to a pair of wiring members 13 interposing the groove (for example, a pair of the wiring members 13$a$ and 13$b$, a pair of the wiring members 13$b$ and 13$c$ in FIG. 4B).

According to this variation, the width W2 of the flexible substrate 10A can be made narrower than the width W1 of the flexible substrate 10. This may reduce the amount of substrate material required and production costs.

Embodiment 2

Figure 7:
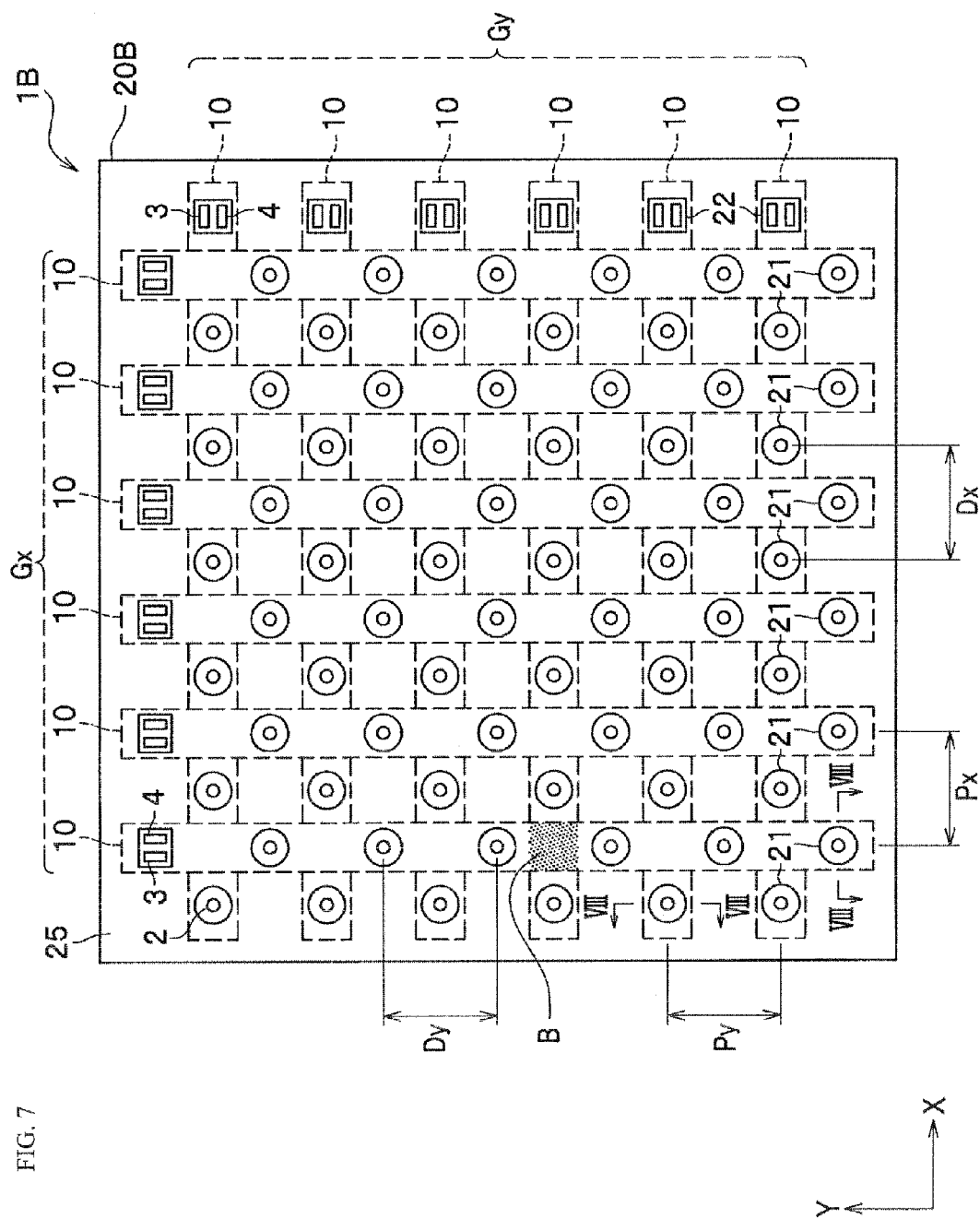
FIG. 7 is a schematic plan view of the light emitting device according to Embodiment 2.
Figure 8:
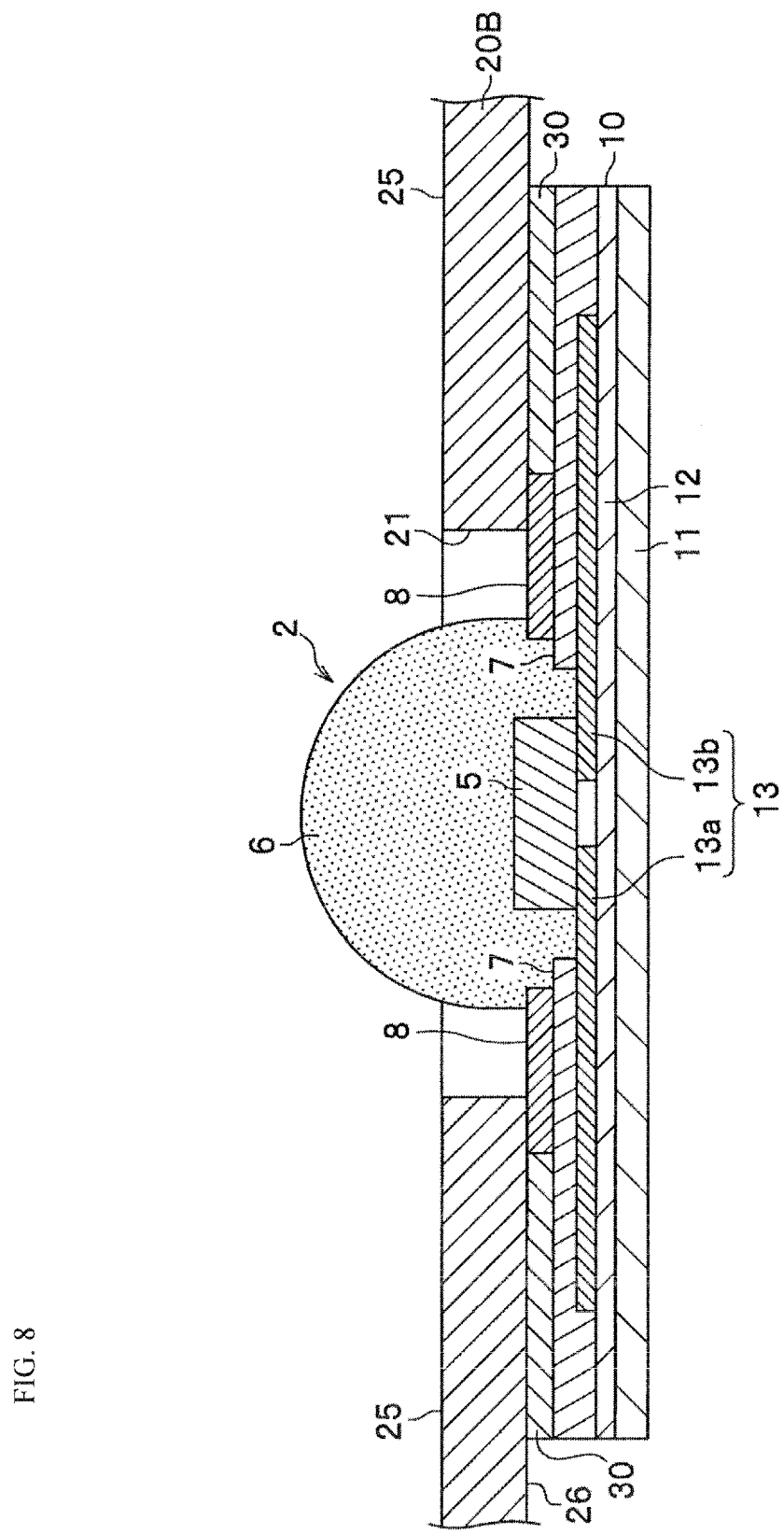
FIG. 8 is an enlarged cross-sectional view of the flexible substrate of the light emitting device according to Embodiment 2 viewed in the direction indicated by arrows VIII-VIII in FIG. 7.

As shown in FIGS. 7 and 8, the light emitting device 1B according to Embodiment 2 differs from the light emitting device 1 according to Embodiment 1 by the reflective sheet 20B being adhered to the upper face side of the flexible substrates 10.

The reflective sheet 20B has through holes 21 each exposing a light emitting section 2 and at least one portion of the reflective layer 8 shown in FIG. 8.

In the reflective sheet 20B, the through holes 21 are created at substantially the same intervals (Dx, Dy) as those of a plurality of light emitting sections 2 mounted on the flexible substrates 10. The number of the through holes 21 is the same as that of the light emitting sections 2 (72 shown here).

The reflective sheet 20B also has through holes 22 to expose the connectors 3 and 4 provided on the flexible substrates 10.

In this embodiment, as shown in FIG. 7, the light emitting device 1B is such that the flexible substrates 10 of the first flexible substrate group Gx and the second flexible substrate group Gy are layered, and their upper faces 15 as shown in FIG. 2 are adhered to the rear face 26 of the reflective sheet 20B in FIG. 8. At this time, the upper faces 15 of the flexible substrates 10 are adhered to the rear face 26 (that is, the face opposite the light reflecting face) of the reflective sheet 20B so as to expose the light emitting sections 2 at the through holes 21 of the reflective sheet 20B. The adhesive members 30 adhere the flexible substrates 10 to the reflective sheet 20 in the regions where the reflective layer 8 is not formed.

As shown in FIG. 7, the flexible substrates 10 are layered to form a lattice on the rear face 26 of the reflective sheet 20B. The light emitting sections 2 provided on the flexible substrates 10 are positioned between regions B (only one is indicated in FIG. 7) which are the lattice points. The regions B, similar to regions A in FIG. 1, represent the regions where the flexible substrates 10 overlap one another.

As shown in FIG. 8, the reflective layer 8 provided over the flexible substrate 10 is disposed on the upper face of the wiring member 13, particularly in the vicinity of the light emitting section 2, that is region corresponding to a through hole 21 of the reflective sheet 20B. In this embodiment, the reflective layer 8 is formed in an annular shape in a plan view, and disposed spaced apart from the wiring member 13 in the stacking direction by the interposing underlayer 7 on the flexible substrate 10. Since the light emitting device 1B has the reflective sheet 20B on the emission side, the area of the reflective layer 8 on the flexible substrate 10 can be reduced, thereby reducing production costs. Furthermore, the flexible substrates 10 for the first and second flexible substrate groups Gx and Gy can be of common construction because there may no need to vary the locations of the reflective layer 8.

Process for Manufacturing a Light Emitting Device

Next, a process for producing the light emitting device 1B will be explained.

Figure 9A:
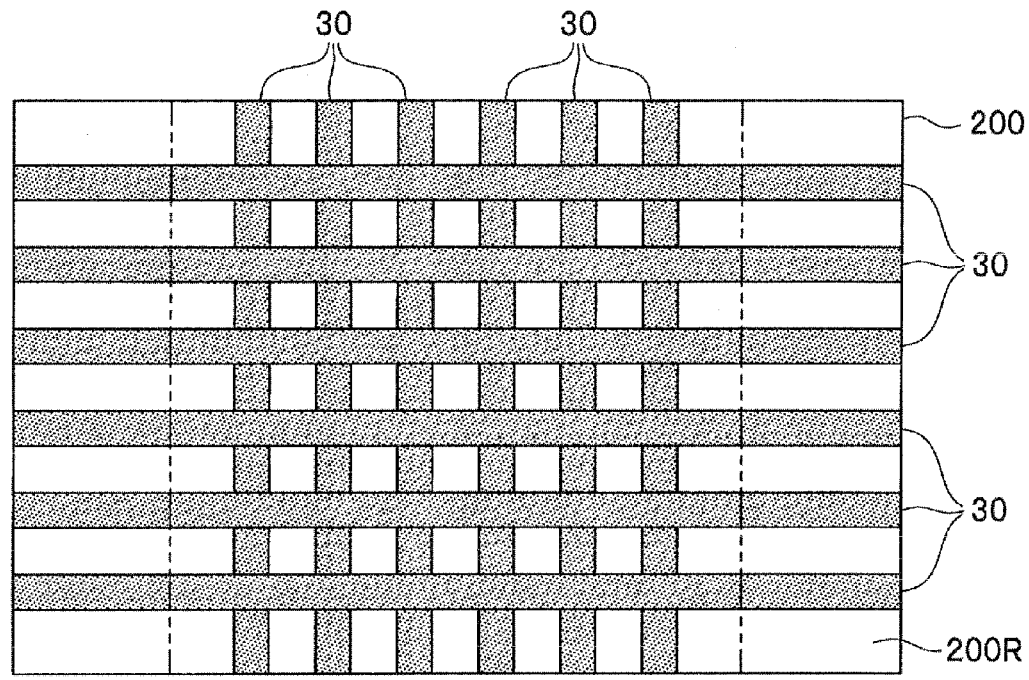
FIG. 9A is a schematic view showing a production step for the light emitting device according to Embodiment 2, which is a plan view of the reflective sheet to which an adhesive members are provided.

First, as shown in FIG. 9A, a reflective sheet 200 larger than the outer shape of the light emitting device 1 is prepared. The reflective sheet 200 shown in this embodiment is horizontally oblong, having the vertical length that is equivalent to the finished product height of the light emitting device 1.

Next, adhesive members 30 are disposed on the rear face 200R of the reflective sheet 200. The adhesive members 30 have a length that is the same as, or longer than, the length of the flexible substrates 10, and about the same width as that of the flexible substrates 10. The adhesive members 30 shown in this embodiment are acrylic-based double-sided tape. A plurality of adhesive members 30 are adhered to the reflective sheet 200 in alignment with the positions of the first flexible substrate group Gx and the second flexible substrate group Gy.

Figure 9B:
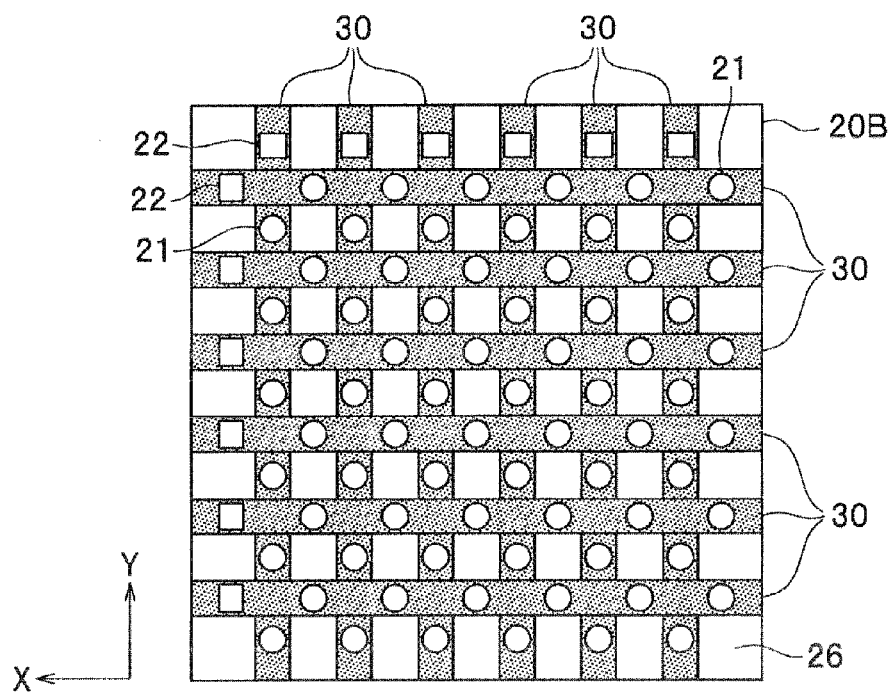
FIG. 9B is a schematic view showing a production step for the light emitting device according to Embodiment 2, which is a plan view of the reflective sheet which has undergone cutting and hole-making machining operations.

Next, as shown in FIG. 9B, through holes 21 and 22 are created in the reflective sheet 200, and the reflective sheet 200 is cut to a width of the finished product (the light emitting device 1). The through holes 21 and 22 are preferably created simultaneously when the reflective sheet 200 is cut to size. Here, the positions of the through holes 21 are matched to the positions of the light emitting sections 2 on the flexible substrates 10. The positions of the through holes 22 are matched to the positions of the connectors 3 and 4 on the flexible substrates 10. The through holes 21 and 22 are formed so as to penetrate through both the reflective sheet 200 and the adhesive members 30. The reflective sheet after cutting is denoted as reflective sheet 20B.

Figure 10A:
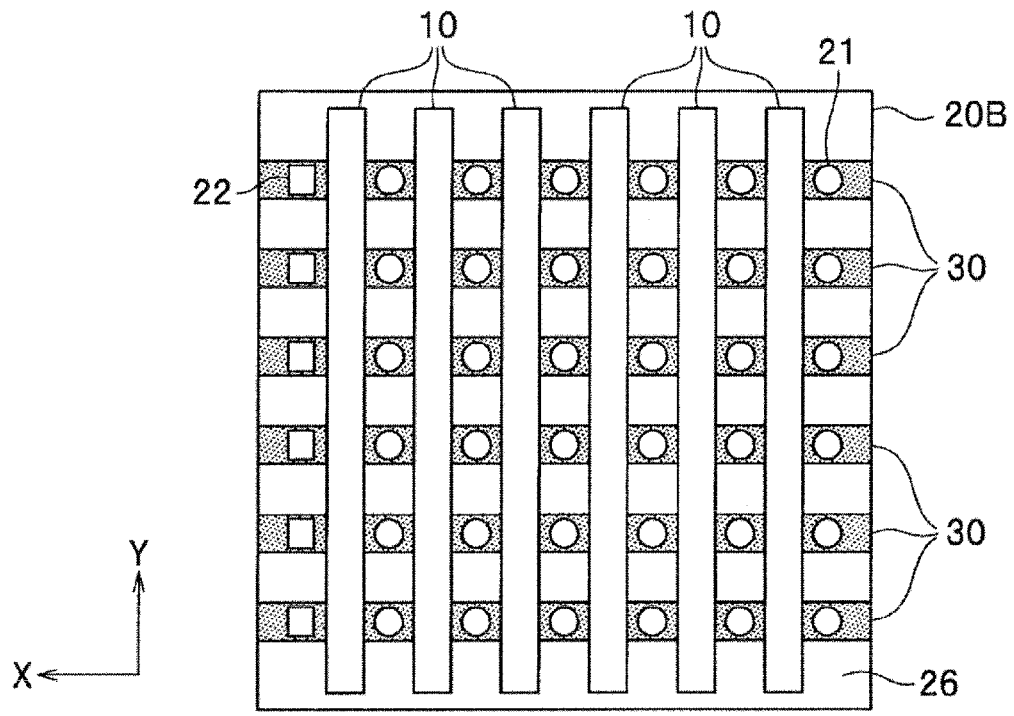
FIG. 10A is a schematic view showing a production step for the light emitting device according to Embodiment 2, which is a rear view of the reflective sheet to which a first flexible substrate group is bonded.

Then, as shown in FIG. 10A, the flexible substrates 10 of the first flexible substrate group Gx are adhered to the rear face 26 of the reflective sheet 20B by aligning them so that the light emitting sections 2 disposed on the faces of the flexible substrates 10 opposite the back faces 16 are exposed at the through holes 21 of the reflective sheet 20B. On the upper face 15 side of the flexible substrates 10, the underlayer 7 disposed at the peripheries of the light emitting sections 2 adheres to the reflective sheet 20 via the adhesive members 30.

Figure 10B:
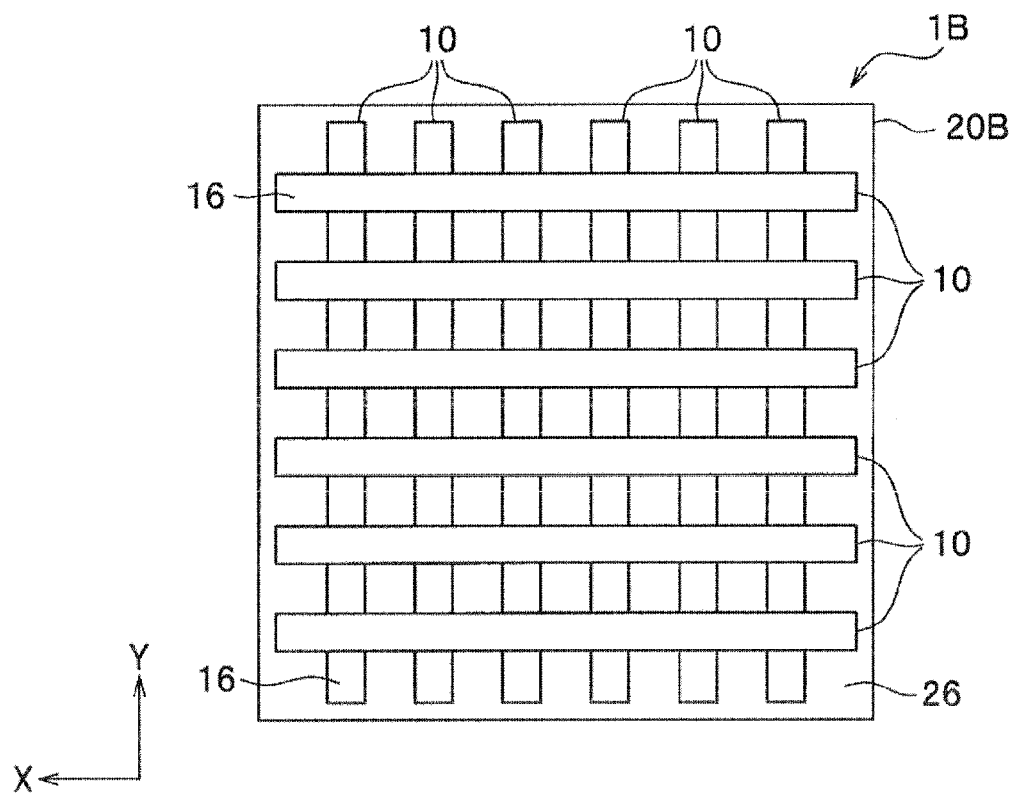
FIG. 10B is a schematic view showing a production step for the light emitting device according to Embodiment 2, which is a rear view of the reflective sheet to which a second flexible substrate group is further bonded.

Then, as shown in FIG. 10B, the flexible substrates 10 of the second flexible substrate group Gy are adhered to the rear face 26 of the reflective sheet 20B by aligning them so that the light emitting sections 2 disposed on the faces of the flexible substrates 10 opposite the back faces 16 are exposed at the through holes 21 of the reflective sheet 20B.

The light emitting device 1B according to this embodiment is constructed by lining up at a prescribed pitch and pasting the plural flexible substrates 10 to the reflective sheet 20B having a larger area than the flexible substrates. Thus, the insulating properties of the flexible substrates 10 can be ensured by the reflective sheet 20B. Moreover, the reflective sheet 20B can increase the light extraction efficiency by reducing the light emitted from the light emitting sections 2 from being absorbed by the flexible substrates 10.

Embodiment 3

Figure 11:
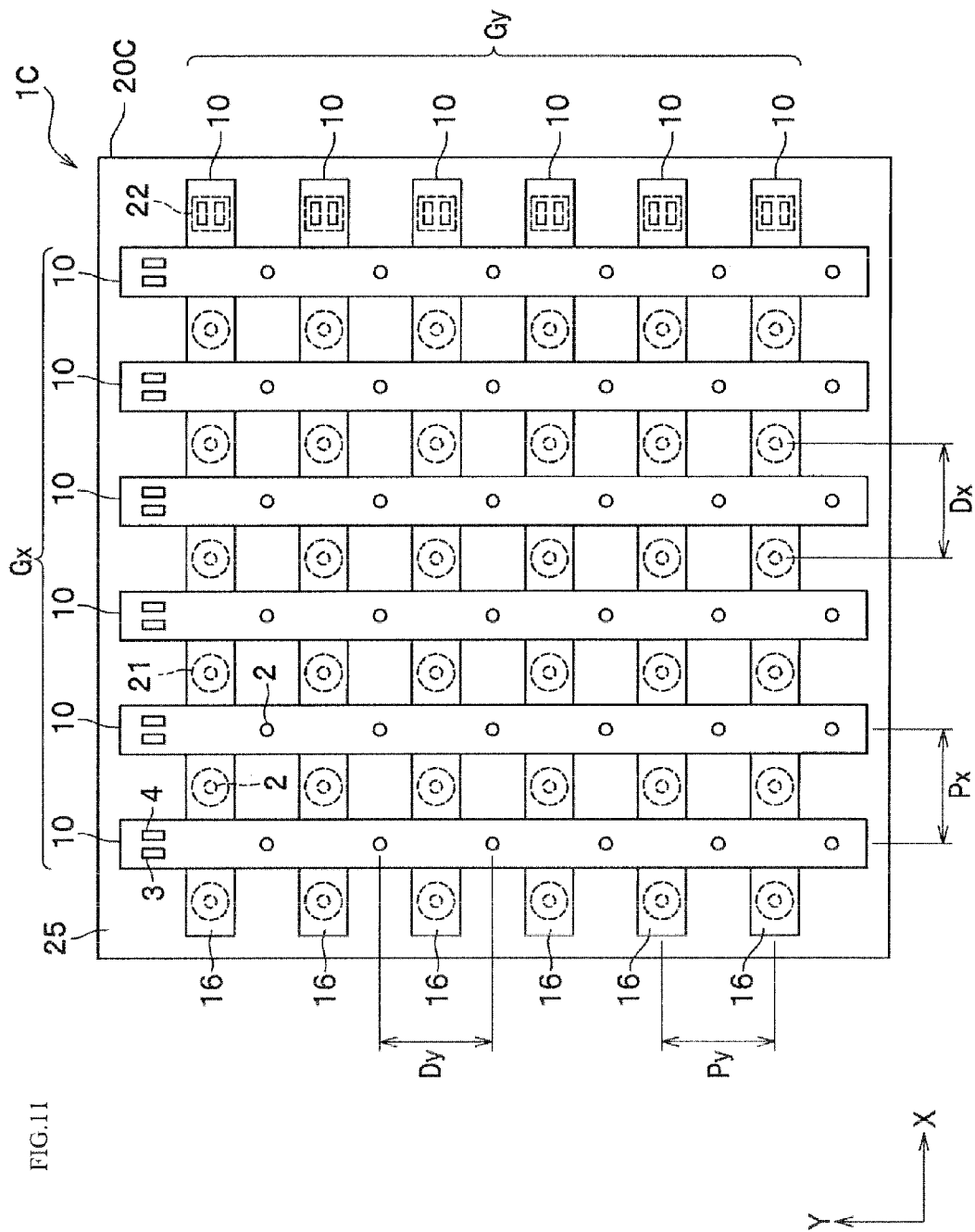
FIG. 11 is a schematic plan view of the light emitting device according to Embodiment 3.

As shown in FIG. 11, the light emitting device 1C according to Embodiment 3 differs from the light emitting device 1 according to Embodiment 1 such that it is a double-side emitting type light emitting device where light can be emitted from the rear face side. The light emitting device 1C can be produced by adhering the upper face side of the flexible substrates 10 of the second flexible substrate group Gy to the reflective sheet 20C to also emit light on the back side.

For the light emitting device 1C, it is preferable to dispose the reflective layer 8 across the entire upper faces of the flexible substrates 10 of the first flexible substrate group Gx. On the other hand, the reflective layer 8 is preferably disposed on the flexible substrates 10 of the second flexible substrate group Gy in the vicinities of the light emitting sections 2 (that is, the regions corresponding to the through holes 21 of the reflective sheet 20C) formed annular in shape.

The reflective sheet 20C has through holes 21 each exposing a light emitting section 2 and at least one portion of the reflective layer 8 as shown in FIG. 8 disposed on the flexible substrates 10 of the second flexible substrate group Gy. The number of the through holes 21 is the same as that of the light emitting sections 2 of the second flexible substrate group Gy (36 shown here). The reflective sheet 20C also has through holes 22.

Next, the process for manufacturing the light emitting device 1C will be explained with reference to FIGS. 9 and 5 by focusing on the differences from the process for manufacturing the light emitting device 1B.

First, as shown in FIG. 9A, adhesive members 30 are disposed on the front face 200F (FIG. 5A) of the reflective sheet 200. Then, as shown in FIG. 9B, through holes 21 and 22 are created, and at the same time, the reflective sheet 200 is cut to a width of the finished product (the light emitting device 1). Here, the positions and the number of through holes 21 are set to correspond to the light emitting sections 2 of the second flexible substrate group Gy. As shown in FIG. 9A, through holes 21 and 22 are created so as to penetrate through only the adhesive members 30 extending in the x-axis direction shown in FIG. 9B.

Next, the upper faces 15 of the flexible substrates 10 of the second flexible substrate group Gy are bonded to the front face 25 of the reflective sheet 20C so as to expose their light emitting sections 2 at the through holes 21 of the reflective sheet 20C as shown in FIG. 11.

Then, as shown in FIG. 11, the back faces 16 of the flexible substrates 10 of the first flexible substrate group Gx are bonded via the adhesive members 30 to the front face 25 of the reflective sheet 20C.

The light emitting device 1C according to this embodiment as described above can provide a double-sided emission type device having the characteristics of both the light emitting devices 1 and 1B. A light reflecting layer made of a white resin or the like may be formed, as needed, in the regions of the back faces 16 of the flexible substrates 10 of the second flexible substrate group Gy that do not overlap with the first flexible substrate group Gx. This can increase the light extraction efficiency by reducing the light emitted from the light emitting sections 2 from being absorbed by the back faces 16 of the flexible substrates 10 on the front side of the light emitting device 1C (the front face 25 side of the reflective sheet 20C).

Embodiment 4

The light emitting device can also include the first and second flexible substrate groups Gx and Gy adhered on different faces of the reflective sheet 20 when layering the flexible substrates 10 in the thickness-wise direction. It may be constructed, for example, as the light emitting device 1D according to Embodiment 4 shown in FIG. 12. The light emitting device 1D is a single-side emission type the light emitting device 1C shown in FIG. 11 so converted by the second flexible substrate group Gy to the rear face side of the reflective sheet 20C and flipping it over to be adhered.

For the light emitting device 1D, it is preferable to dispose the reflective layer 8 across the entire upper faces of the flexible substrates 10 of the first flexible substrate group Gx. On the other hand, the reflective layer 8 is preferably disposed on the flexible substrates 10 of the second flexible substrate group Gy in the vicinities of the light emitting sections 2 (that is, the regions corresponding to the through holes 21 of the reflective sheet 20C) formed annular in shape.

Figure 12:
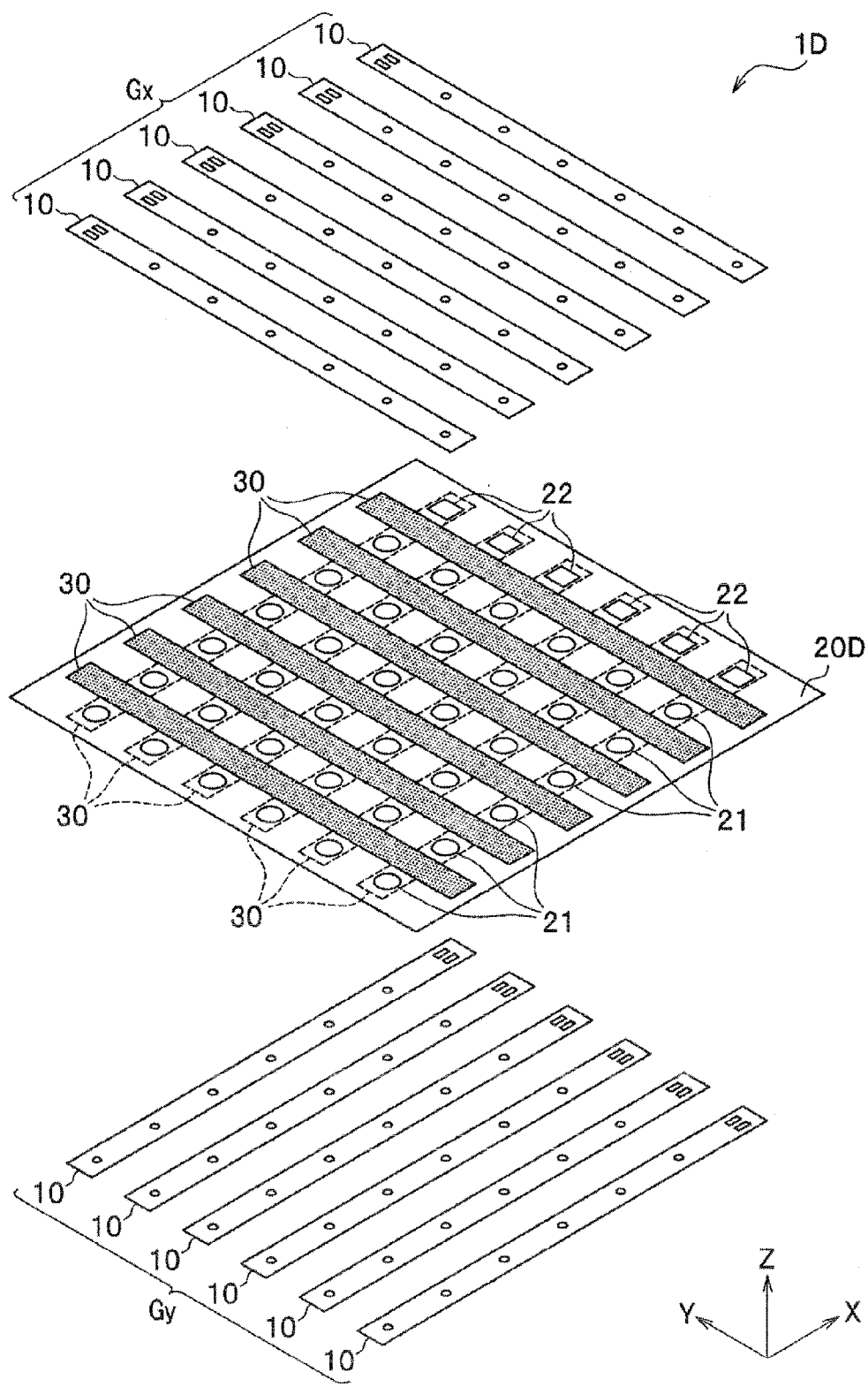
FIG. 12 is an exploded perspective view of the light emitting device according to Embodiment 4.

In the light emitting device 1D, as shown in FIG. 12, the back faces of the flexible substrates 10 of the first flexible substrate group Gx are adhered to the front face of the reflective sheet 20D via the adhesive members 30. The upper faces of the flexible substrates 10 of the second flexible substrate group Gy are adhered to the rear face of the reflective sheet 20D via the adhesive members 30 so as to expose their light emitting sections 2 at the through holes 21 of the reflective sheet 20D.

In the light emitting device 1D, the adhesive members 30 are disposed on both faces of the reflective sheet 20D. The number and the positions of the through holes 21 and 22 provided in the reflective sheet 20D are the same as those of the reflective sheet 20C shown in FIG. 11. With this construction, by providing only half as many through holes 21 as the total number of light emitting sections 2, the light emitting device 1D can be made into a single-side emission type device as in the case of the light emitting device 1 while ensuring the insulating properties of the second flexible substrate group Gy.

Embodiment 5

Next, another embodiment in which the first and second flexible substrate groups Gx and Gy are adhered to different faces of the reflective sheet 20 will be explained. It may be constructed, for example, as the light emitting device 1E according to Embodiment 5 shown in FIG. 13. The light emitting device 1E is a double-side emission type of the light emitting device 1B shown in FIG. 7 so converted by moving the first flexible substrate group Gx to the front face 25 side of the reflective sheet 20B and flipping it over to be adhered.

In the light emitting device 1E, the reflective layer 8 on each flexible substrate 10 is disposed in the vicinities of the light emitting sections 2 (regions corresponding to the through holes 21 of the reflective sheet 20E) formed annular in shape.

Figure 13:
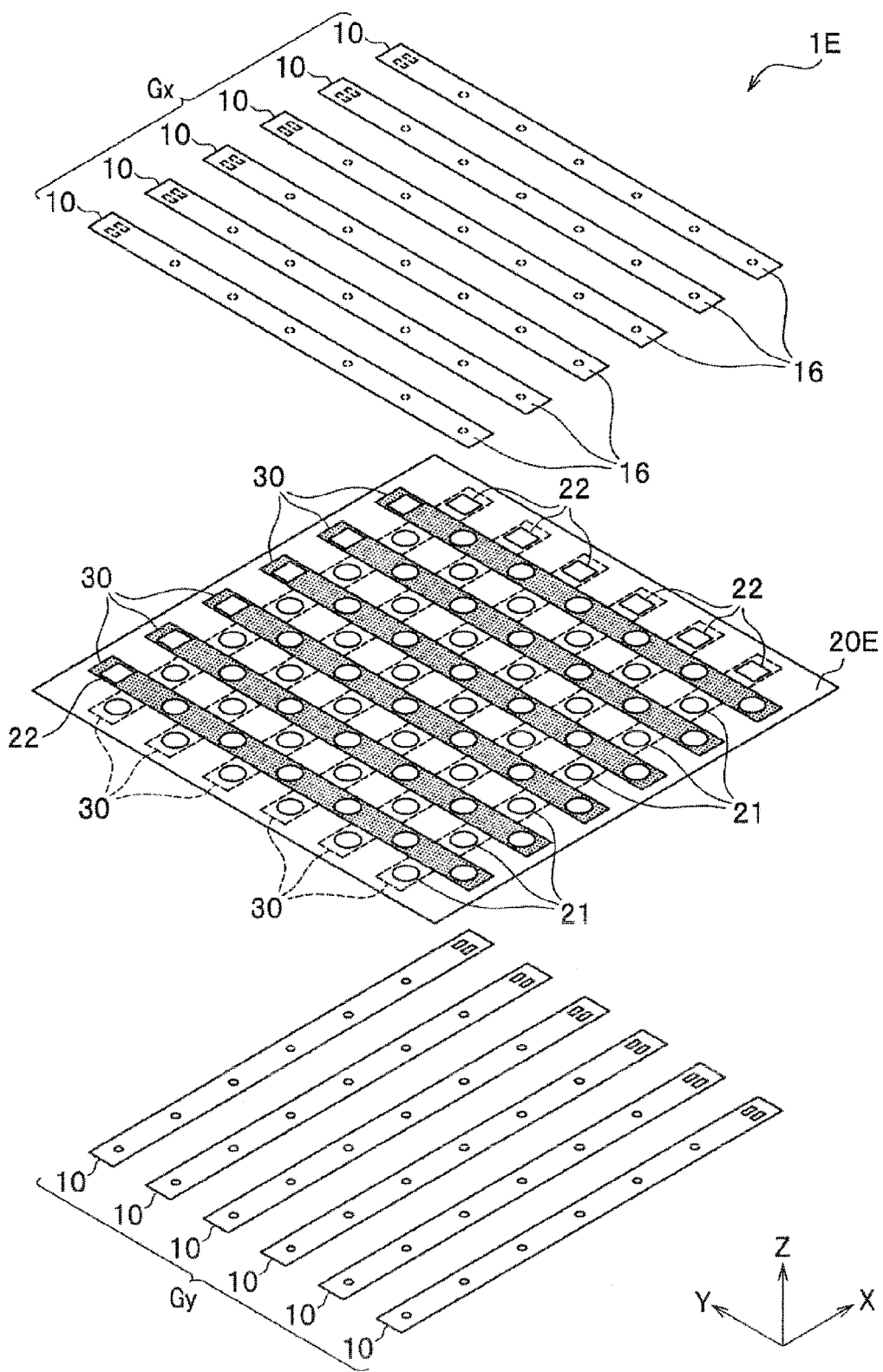
FIG. 13 is an exploded perspective view of the light emitting device according to Embodiment 5.

In the light emitting device 1E, as shown in FIG. 13, the upper faces of the flexible substrates 10 of the first flexible substrate group Gx are adhered to the front face of the reflective sheet 20E via the adhesive members 30 so as to expose their light emitting sections 2 at the through holes 21 of the reflective sheet 20E. In the light emitting device 1E, moreover, the upper faces of the flexible substrates 10 of the second flexible substrate group Gy are adhered to the rear face of the reflective sheet 20E via the adhesive members 30 so as expose their light emitting sections 2 at the through holes 21 of the reflective sheet 20E.

In the light emitting device 1E, the adhesive members 30 are disposed on both faces of the reflective sheet 20E. The number and the positions of the through holes 21 and 22 provided in the reflective sheet 20E are the same as the reflective sheet 20B shown in FIG. 7. For the light emitting device 1E, a light reflecting layer made of a white resin or the like may be formed, as needed, on the back faces 16 of the flexible substrate 10. With this construction, the light emitting device 1E can become a double-side emission type device as in the case of the light emitting device 1C while ensuring the insulating properties of all of the flexible substrates 10.

Embodiment 6

Yet another embodiment in which the first and second flexible substrate groups Gx and Gy are adhered to different faces of the reflective sheet 20 will be explained. It may be constructed, for example, as the light emitting device 1F according to Embodiment 6 shown in FIG. 14. The light emitting device 1F is a double-side emission type version of the light emitting device 1 shown in FIG. 1 so converted by moving the second flexible substrate group Gy to the rear face side of the reflective sheet 20 and flipping it over to be adhered.

In the light emitting device 1F, it is preferable to dispose the reflective layer 8 across the entire upper face of each flexible substrate 10.

In the light emitting device 1F, as shown in FIG. 14, the back faces of the flexible substrates 10 of the first flexible substrate group Gx are adhered to the front face of the reflective sheet 20F via the adhesive members 30. Moreover, the back faces 16 of the flexible substrates 10 of the second flexible substrate group Gy are adhered to the rear face of the reflective sheet 20F via the adhesive members 30.

In the light emitting device 1F, the adhesive members 30 are disposed on both faces of the reflective sheet 20F. The reflective sheet 20F is substantially the same as the reflective sheet 20 shown in FIG. 1. With this construction, the light emitting device 1F can become a double-side emission type device as in the case of the light emitting device 1C without any through holes in the reflective sheet 20F.

Embodiment 7

Figure 15:
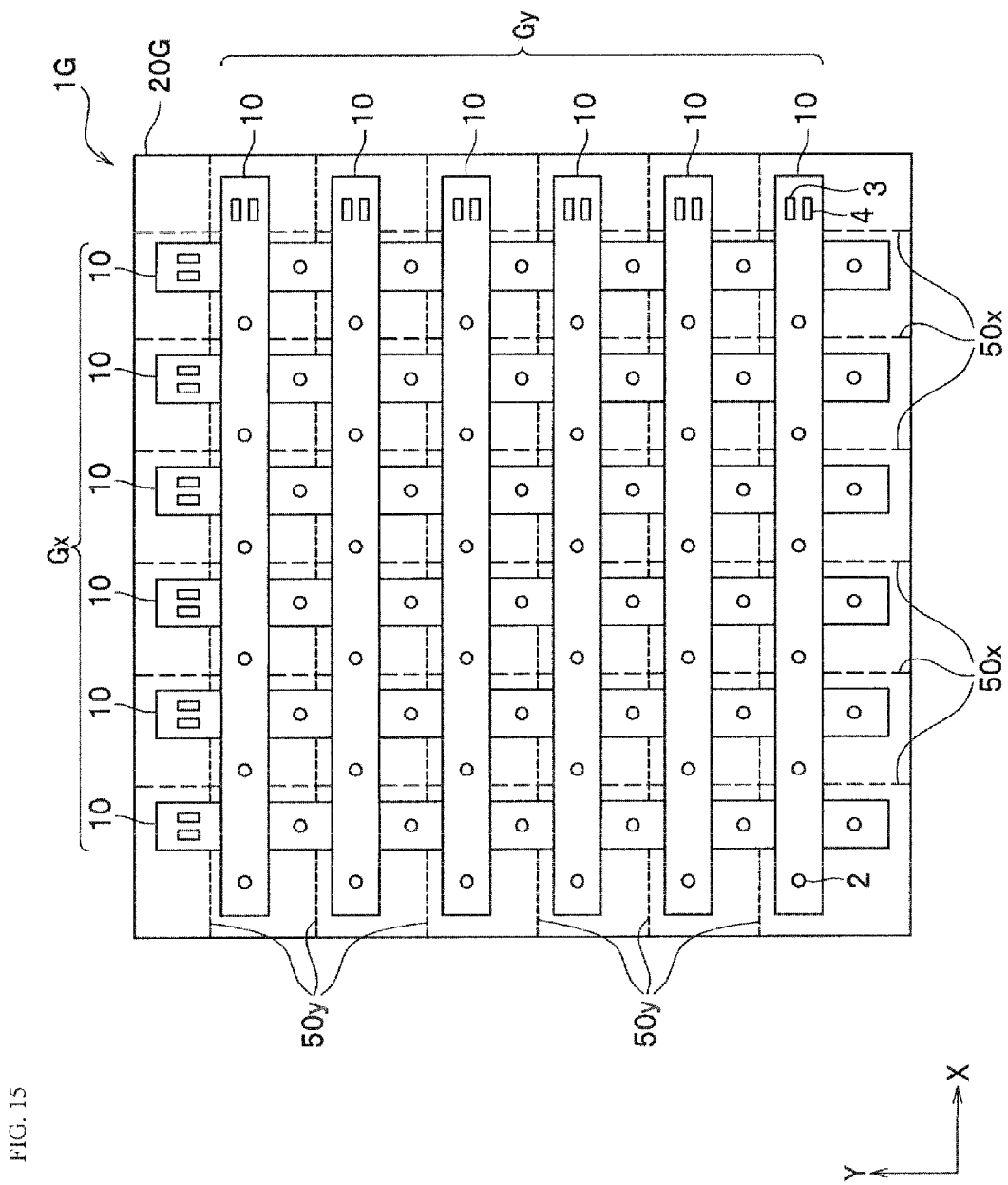
FIG. 15 is a schematic plan view of the light emitting device according to Embodiment 7.

The light emitting devices according to certain embodiments further include a feature to reduce warping that can be caused by, for example, temperature and/or humidity. As shown in FIG. 15, the light emitting device 1G according to Embodiment 7 differs from the light emitting device 1 according to Embodiment 1 by having a reflective sheet 200 provided with broken-line shaped slits 50x and 50y. The slits 50x and 50y are provided to reduce warping resulting from, for example, temperature and/or humidity.

For the light emitting device 1G, it is preferable to dispose the reflective layer 8 across the entire upper faces of the flexible substrates 10 of the second flexible substrate group Gy, while disposing the reflective layer 8 in the regions of the flexible substrates 10 of the first flexible substrate group Gx where the flexible substrates 10 of the second flexible substrate group Gy are not layered thereon.

The slits 50x are created in the direction substantially perpendicular to the flexible substrates 10 of the second flexible substrate group Gy (y-axis direction) by perforating. A plurality of slits 50x (six shown here) are provided in the reflective sheet 20G at intervals in the x-axis direction. The slits 50x are created at positions that deviate from the flexible substrates 10 of the first flexible substrate group Gx. The slits 50x are created at positions that deviate from the light emitting sections 2 of the flexible substrates 10 of the second flexible substrate group Gy.

The slits 50y are created in the direction substantially perpendicular to the flexible substrates 10 of the first flexible substrate group Gx (x-axis direction) by perforating. A plurality of slits 50y (six shown here) are provided in the reflective sheet 20G at intervals in the y-axis direction. The slits 50y are created at positions that deviate from the flexible substrates 10 of the second flexible substrate group Gy. The slits 50y are created at positions that deviate from the light emitting sections 2 of the flexible substrates 10 of the first flexible substrate group Gx.

The distance between the slits 50, and the length and width of the slits 50 can be suitably selected depending on, for example, the strength required of the light emitting device 1G. The slits are preferably provided next to the light emitting sections 2 of the flexible substrates 10. The number of slits can be suitably selected. In the slits 50x and 50y, the sizes of the slits 50 may be common to all or different. The spacing between the slits may be common to all or different.

In producing the light emitting device 1G, a step of perforating the unprocessed reflective sheet 200 is additionally performed prior to disposing the adhesive members 30 on the reflective sheet 200 (see FIG. 5A). Thereafter, the device can be produced in the same manner as in the case of the light emitting device 1.

In cases where the respective materials mentioned earlier are used for the reflective sheet 20G and the flexible substrates 10 of the light emitting device 1G, the reflective sheet 20G will have a higher rate of heat shrinkage than the flexible substrates 10. For example, under constant temperature and constant humidity conditions, a member which the two materials having different rates of heat shrinkage and coefficients of thermal expansion are bonded tends to reveal different dimensional changes between the two bonded materials, which may cause warping of the member. However, the light emitting device 1G employs the reflective sheet 20G provided with the slits 50, and thus warping can be reduced as the gaps formed by the slits 50 expand when the reflective sheet 20G shrinks due to temperature and/or humidity. According to the light emitting device 1G, therefore, warping can be effectively reduced even when the device is placed, for example, in a high-temperature and high-humidity location, or is heated or dried.

Variation 1

In each of the embodiments described above, a plurality of light emitting sections 2 mounted on the flexible substrates 10 of the first flexible substrate group Gx may have a different color tone than that of a plurality of light emitting sections 2 mounted on the flexible substrates 10 of the second flexible substrate group Gy.

For example, the light emitting device 1 shown in FIG. 1 can have the sealing material 6 for the light emitting sections 2 of the first flexible substrate group Gx contain a fluorescent material, and have the sealing material 6 for the light emitting sections 2 of the second flexible substrate group Gy contain no fluorescent material.

It can have the sealing material 6 for the light emitting sections 2 of the first flexible substrate group Gx contain a first fluorescent material, and have the light emitting sections 2 of the second flexible substrate group Gy contain a second fluorescent material.

Furthermore, characteristics of the light emitting elements 5 of the first flexible substrate group Gx and those of the second flexible substrate group Gy can be varied, while using a common sealing material 6, or both the light emitting elements 5 and the sealing material 6 can be varied.

Constructing the light emitting device in this way can provide, in lighting applications, for example, a switching function between daylight, natural white, and incandescent light colors.

Variation 2

In each of the embodiments described above, the reflective layer 8 on the flexible substrates 10 is disposed spaced apart from the wiring patterns in the stacking direction by interposing the underlayer 7. However, the underlayer 7 may not be disposed immediately below the reflective layer 8, and the reflective layer 8 may be disposed directly on the wiring patterns on the flexible substrates 10.

Moreover, in the light emitting devices 1B and 1E, the insulating properties of all of the flexible substrates 10 can be ensured by the reflective sheets 20B and 20E, respectively, and thus the underlayer 7 may be eliminated entirely. In the light emitting device 1D, the insulating properties of the Gy can be ensured by the reflective sheet 20D, and thus the underlayer 7 for the flexible substrates 10 of Gy may be eliminated entirely. In these cases, the production costs for a large area light emitting device can be reduced.

Variation 3

In the light emitting devices according to the embodiments discussed above, the connectors 3 and 4 on the flexible substrates 10 are connected to an external power supply using a wire harness. However, a relay board provided with a wiring pattern can be directly connected to the wiring member 13 by soldering, without using the connectors 3 and 4. The relay board may be a general circuit board, but is preferably an oblong flexible substrate. Such a construction requires no wire harnesses or connectors, and thus can reduce materials costs. This increases the cost reduction effect particularly in cases where a large number of flexible substrates are used.

Variation 4

In each of the embodiments described above, the shape of the reflective sheet are shown as a rectangle, but the shape of the reflective sheet may be varied. For example, it can be cut to a polygonal, circular, elliptical, or oblong shape. Constructing a light emitting device in this manner can expand the applications.

Other Variations

In each of the embodiments described above, the first substrate group Gx are explained as being substantially perpendicular to the second substrate group Gy, but is not limited to that. In other words, the included angle formed by the intersecting flexible substrates 10 can be 90 degrees, and can suitably be selected depending on the purpose and/or application. The pitches Px and Py for the flexible substrates 10, and the pitches Dx and Dy for the light emitting sections 2 can suitably be selected as well.

In the processes for producing the light emitting devices according to the above embodiments, the second flexible substrate group Gy are bonded to the reflective sheet 20 after bonded the first flexible substrate group Gx. However, the order for bonded the flexible substrates 10 is optional.

The light emitting devices according to the embodiments described in this disclosure can be used as various types of light sources applicable to lighting fixtures, various indicators, automotive lights, displays, liquid crystal display backlights, sensors, traffic signals, automotive parts, signboard channel letters, and the like.

What is claimed is:

1. A light emitting device comprising:
a reflective sheet having a light reflecting face;
a plurality of oblong flexible substrates; and
a plurality of light emitting sections disposed at intervals on a face of each of the flexible substrates,
wherein the plurality of the flexible substrates comprises a first group of flexible substrates that are lined up at intervals in a first direction and a second group of flexible substrates that are lined up at intervals in a second direction such that the flexible substrates of the second group intersect the flexible substrates of the first group,
wherein the first group and the second group are layered in a thickness direction and adhered to at least one face of the reflective sheet so as to expose the plurality of light emitting sections,
wherein the reflective sheet includes at least as many through holes as a number of the light emitting sections disposed on the flexible substrates of the second group, located at substantially the same intervals as those of the light emitting sections disposed on the flexible substrates of the second group, wherein a face of each flexible substrate of the second group having the light emitting sections is adhered to a face of the reflective sheet that is opposite the light reflecting face, such that the light emitting sections of the second group are exposed via the through holes of the reflective sheet, and wherein a face of each flexible substrate of the first group having no light emitting sections is adhered to the face of the reflective sheet that is opposite the light reflecting face and to the faces of flexible substrates of the second group having no light emitting sections.

2. The light emitting device according to claim 1, wherein each flexible substrate of the second group is arranged in a direction substantially perpendicular to each flexible substrate of the first group.

3. The light emitting device according to claim 1, wherein the reflective sheet includes at least as many through holes as a number of the light emitting sections, located at substantially the same intervals as those of the light emitting sections, and wherein faces of the flexible substrates of the first and second groups having the light emitting sections are adhered to a face of the reflective sheet that is opposite the light reflecting face, such that the light emitting sections are exposed via the through holes of the reflective sheet.

4. The light emitting device according to claim 1, wherein faces of the flexible substrates of the first and second groups having no light emitting sections are adhered to the light reflecting face of the reflective sheet.

5. The light emitting device according to claim 1, wherein the reflective sheet includes at least as many through holes as a number of the light emitting sections disposed on the flexible substrates of the second group, located at the same intervals as those of the light emitting sections disposed on the flexible substrates of the second group, wherein a face of each flexible substrate of the second group having the light emitting sections is adhered to a face of the reflective sheet that is opposite the light reflecting face, such that the light emitting sections of the second group are exposed via the through holes of the reflective sheet, and wherein a face of each flexible substrate of the first group having no light emitting sections is adhered to the light reflecting face of the reflective sheet.

6. The light emitting device according to claim 1, wherein a plurality of the light emitting sections disposed on the flexible substrates of the first group have a different color tone from that of a plurality of the light emitting sections disposed on the flexible substrates of the second group.

7. The light emitting device according to claim 1, wherein the reflective sheet has a plurality of first rows of slits extending in a direction substantially perpendicular to a longitudinal direction of the flexible substrates of the first group, the first rows of slits being located such that they do not pass through locations of the light emitting sections of the first group.

8. The light emitting device according to claim 7, wherein the reflective sheet has a plurality of second rows of slits extending in a direction substantially perpendicular to a longitudinal direction of the flexible substrates of the second group, the second rows of slits being located such that they do not pass through locations of the light emitting sections of the second group.

9. A light emitting device comprising:
a reflective sheet having a light reflecting face;
a plurality of oblong flexible substrates; and
a plurality of light emitting sections disposed at intervals on a face of each of the flexible substrates, wherein the plurality of the flexible substrates comprises a first group of flexible substrates that are lined up at intervals in a first direction and a second group of flexible substrates that are lined up at intervals in a second direction such that the flexible substrates of the second group intersect the flexible substrates of the first group, wherein the first group and the second group are layered in a thickness direction and adhered to at least one face of the reflective sheet so as to expose the plurality of light emitting sections, wherein the reflective sheet includes at least as many through holes as a total number of the light emitting sections, located at the same intervals as those of the light emitting sections, wherein a face of each flexible substrate of the first group having the light emitting sections is adhered to a face of the reflective sheet that is opposite the light reflecting face, such that the light emitting sections of the first group are exposed via the through holes of the reflective sheet, and wherein a face of each flexible substrate of the second group having the light emitting sections is adhered to the light reflecting face of the reflective sheet, such that the light emitting sections of the second group are exposed via the through holes of the reflective sheet.

10. The light emitting device according to claim 9, wherein each flexible substrate of the second group is arranged in a direction substantially perpendicular to each flexible substrate of the first group.

11. The light emitting device according to claim 9, wherein the reflective sheet includes at least as many through holes as a number of the light emitting sections, located at substantially the same intervals as those of the light emitting sections, and wherein faces of the flexible substrates of the first and second groups having the light emitting sections are adhered to a face of the reflective sheet that is opposite the light reflecting face, such that the light emitting sections are exposed via the through holes of the reflective sheet.

12. The light emitting device according to claim 9, wherein faces of the flexible substrates of the first and second groups having no light emitting sections are adhered to the light reflecting face of the reflective sheet.

13. The light emitting device according to claim 9, wherein the reflective sheet includes at least as many through holes as a number of the light emitting sections disposed on the flexible substrates of the second group, located at the same intervals as those of the light emitting sections disposed on the flexible substrates of the second group, wherein a face of each flexible substrate of the second group having the light emitting sections is adhered to a face of the reflective sheet that is opposite the light reflecting face, such that the light emitting sections of the second group are exposed via the through holes of the reflective sheet, and wherein a face of each flexible substrate of the first group having no light emitting sections is adhered to the light reflecting face of the reflective sheet.

14. The light emitting device according to claim 9, wherein a plurality of the light emitting sections disposed on the flexible substrates of the first group have a different color tone from that of a plurality of the light emitting sections disposed on the flexible substrates of the second group.

15. The light emitting device according to claim 9, wherein the reflective sheet has a plurality of first rows of slits extending in a direction substantially perpendicular to a longitudinal direction of the flexible substrates of the first group, the first rows of slits being located such that they do not pass through locations of the light emitting sections of the first group.

16. The light emitting device according to claim 15, wherein the reflective sheet has a plurality of second rows of slits extending in a direction substantially perpendicular to a longitudinal direction of the flexible substrates of the second group, the second rows of slits being located such that they do not pass through locations of the light emitting sections of the second group.

17. A light emitting device comprising:
a reflective sheet having a light reflecting face;
a plurality of oblong flexible substrates; and
a plurality of light emitting sections disposed at intervals on a face of each of the flexible substrates,
wherein the plurality of the flexible substrates comprises a first group of flexible substrates that are lined up at intervals in a first direction and a second group of flexible substrates that are lined up at intervals in a second direction such that the flexible substrates of the second group intersect the flexible substrates of the first group,
wherein the first group and the second group are layered in a thickness direction and adhered to at least one face of the reflective sheet so as to expose the plurality of light emitting sections,
wherein a face of each flexible substrate of the first group having no light emitting sections is adhered to the light reflecting face of the reflective sheet, and
wherein a face of each flexible substrate of the second group having no light emitting sections is adhered to a face of the reflective sheet that is opposite the light reflecting face.

18. The light emitting device according to claim 17, wherein each flexible substrate of the second group is arranged in a direction substantially perpendicular to each flexible substrate of the first group.

19. The light emitting device according to claim 17, wherein the reflective sheet includes at least as many through holes as a number of the light emitting sections, located at substantially the same intervals as those of the light emitting sections, and wherein faces of the flexible substrates of the first and second groups having the light emitting sections are adhered to a face of the reflective sheet that is opposite the light reflecting face, such that the light emitting sections are exposed via the through holes of the reflective sheet.

20. The light emitting device according to claim 17, wherein faces of the flexible substrates of the first and second groups having no light emitting sections are adhered to the light reflecting face of the reflective sheet.

21. The light emitting device according to claim 17, wherein the reflective sheet includes at least as many through holes as a number of the light emitting sections disposed on the flexible substrates of the second group, located at the same intervals as those of the light emitting sections disposed on the flexible substrates of the second group, wherein a face of each flexible substrate of the second group having the light emitting sections is adhered to a face of the reflective sheet that is opposite the light reflecting face, such that the light emitting sections of the second group are exposed via the through holes of the reflective sheet, and wherein a face of each flexible substrate of the first group having no light emitting sections is adhered to the light reflecting face of the reflective sheet.

22. The light emitting device according to claim 17, wherein a plurality of the light emitting sections disposed on the flexible substrates of the first group have a different color tone from that of a plurality of the light emitting sections disposed on the flexible substrates of the second group.

23. The light emitting device according to claim 17, wherein the reflective sheet has a plurality of first rows of slits extending in a direction substantially perpendicular to a longitudinal direction of the flexible substrates of the first group, the first rows of slits being located such that they do not pass through locations of the light emitting sections of the first group.

24. The light emitting device according to claim 23, wherein the reflective sheet has a plurality of second rows of slits extending in a direction substantially perpendicular to a longitudinal direction of the flexible substrates of the second group, the second rows of slits being located such that they do not pass through locations of the light emitting sections of the second group.

* * * * *